(12) United States Patent
Okuno

(10) Patent No.: US 10,916,666 B2
(45) Date of Patent: Feb. 9, 2021

(54) SEMICONDUCTOR DEVICE

(71) Applicant: Mitsubishi Electric Corporation, Tokyo (JP)

(72) Inventor: Koji Okuno, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/541,026

(22) Filed: Aug. 14, 2019

(65) Prior Publication Data

US 2020/0127144 A1 Apr. 23, 2020

(30) Foreign Application Priority Data

Oct. 22, 2018 (JP) ................................. 2018-198246

(51) Int. Cl.
*H01L 29/872* (2006.01)
*H01L 29/78* (2006.01)
*H01L 29/16* (2006.01)

(52) U.S. Cl.
CPC ........ *H01L 29/872* (2013.01); *H01L 29/1608* (2013.01); *H01L 29/7811* (2013.01)

(58) Field of Classification Search
CPC . H01L 29/872; H01L 29/1608; H01L 29/7811
See application file for complete search history.

(56) References Cited

U.S. PATENT DOCUMENTS

| 2006/0086939 | A1 | 4/2006 | Carta et al. | |
| 2013/0161645 | A1* | 6/2013 | Takahashi | H01L 29/0619 257/77 |
| 2013/0341751 | A1* | 12/2013 | Ono | H01L 29/7811 257/488 |
| 2017/0263697 | A1* | 9/2017 | Maeyama | H01L 23/3171 |

FOREIGN PATENT DOCUMENTS

| JP | 2007-103524 A | 4/2007 |
| JP | 2008-518445 A | 5/2008 |
| WO | 2006/047382 A2 | 5/2006 |

* cited by examiner

*Primary Examiner* — Peniel M Gumedzoe
(74) *Attorney, Agent, or Firm* — Studebaker & Brackett PC

(57) ABSTRACT

Provided is a semiconductor device including: a semiconductor layer of a first conductivity type provided on the semiconductor substrate; a first main electrode provided on the semiconductor layer; a second main electrode provided on a main surface of the semiconductor substrate, opposite to a side on which the first main electrode is provided; an electric field limiting region of a second conductivity type provided in an outside terminal end region on an outer peripheral side of the semiconductor device, a first protective film covering at least the electric field limiting region; a protective metal film provided on a portion from an outside end edge portion of the first protective film to a front surface of the semiconductor layer; and a second protective film provided covering portions on an end edge portion of the first main electrode, the first protective film, and the protective metal film.

3 Claims, 14 Drawing Sheets ical field limiting region with an oxide film or a protective film of polyimide or the like. For example, Japanese Patent Application Laid-Open No. 2007-103524 discloses a configuration in which a protective film of polyimide is provided on a channel stopper layer provided on an outer peripheral portion of an SBD chip.

SEMICONDUCTOR DEVICE

BACKGROUND OF THE INVENTION

Field of the Invention

The present invention relates to a semiconductor device, and more particularly to a semiconductor device with improved moisture resistance.

Description of the Background Art

For example, in a semiconductor device such as a vertical schottky barrier diode (SBD) or a metal oxide semiconductor field effect transistor (MOSFET), there is widely known a method for securing withstand voltage by providing a p-type electric field limiting region in a terminal region of a semiconductor chip, in an n-type epitaxial layer provided on an n-type semiconductor substrate, and connecting the p-type electric field limiting region to surface electrodes such as an anode electrode and a source electrode, for example.

This kind of semiconductor device is configured to cover an end portion of the surface electrode and the electric field limiting region with an oxide film or a protective film of polyimide or the like. For example, Japanese Patent Application Laid-Open No. 2007-103524 discloses a configuration in which a protective film of polyimide is provided on a channel stopper layer provided on an outer peripheral portion of an SBD chip.

In terms of physical properties, a silicon carbide (SiC) semiconductor device is superior in withstand voltage to a silicon semiconductor device, and can be expected to reduce its termination region as compared with the silicon semiconductor device. Unfortunately, when the termination region has a strong electric field and the protective film contains water, electrolysis action of the water causes the surface electrode and a surface of a SiC layer to react to each other to form a product, and then the protective film may be peeled due to volume expansion of the product to cause a defect in the semiconductor device.

SUMMARY

It is an object to provide a semiconductor device in which generation of a product formed by electrolytic action of water is suppressed even when a termination region has a strong electric field and a protective film contains water.

A semiconductor device according to the present invention includes: a semiconductor substrate that allows a main current to flow in a thickness direction of the semiconductor substrate; a semiconductor layer of a first conductivity type provided on the semiconductor substrate; a first main electrode provided on the semiconductor layer; a second main electrode provided on a main surface of the semiconductor substrate, opposite to a side on which the first main electrode is provided; an electric field limiting region of a second conductivity type provided in an outside terminal end region on an outer peripheral side of the semiconductor device, outward of an active region in which the main current flows in the semiconductor layer, allowing; a first protective film covering at least the electric field limiting region; a protective metal film provided on a portion from an outside end edge portion of the first protective film to a front surface of the semiconductor layer; and a second protective film provided covering portions on an end edge portion of the first main electrode, the first protective film, and the protective metal film.

According to the above semiconductor device, providing the protective metal film enables extending lifetime even when water enters the inside of the second protective film in a state in which a reverse bias voltage is applied to a diode, or a forward bias voltage is applied to a transistor, for example, by suppressing formation of a product on a surface of the semiconductor layer on a device end edge portion side to suppress peeling of the second protective film and a failure in the semiconductor layer. In addition, suppressing the formation of a product on the surface of the semiconductor layer on the device end edge portion side also suppresses formation of a product on an end edge portion of the first main electrode opposite in potential.

These and other objects, features, aspects and advantages of the present invention will become more apparent from the following detailed description of the present invention when taken in conjunction with the accompanying drawings.

DESCRIPTION OF THE PREFERRED EMBODIMENTS

Introduction

Prior to description of preferred embodiments, there will be described a product formed by electrolysis action of water when a termination region has a strong electric field and a protective film provided in the termination region contains the water.

In the following description, an "active region" is a region through which a main current flows in an on-state of a semiconductor device, and the "termination region" is a region around the active region. In the following, "outside" is a direction toward an outer periphery of a semiconductor device, and "inside" is a direction opposite to the "outside". While an impurity conductivity type is generally defined as follows: an n-type is a "first conductivity type" and a p-type is a "second conductivity type", in the following description, an opposite definition may be used.

In a silicon carbide semiconductor device excellent in withstand voltage, a termination region is reduced for cost reduction and productivity improvement. As a result, the termination region has a strong electric field. As an example of the silicon carbide semiconductor device in which the termination region is reduced as described above, FIG. 1 illustrates a cross-sectional structure of a Schottky barrier diode 90.

Figure 1:
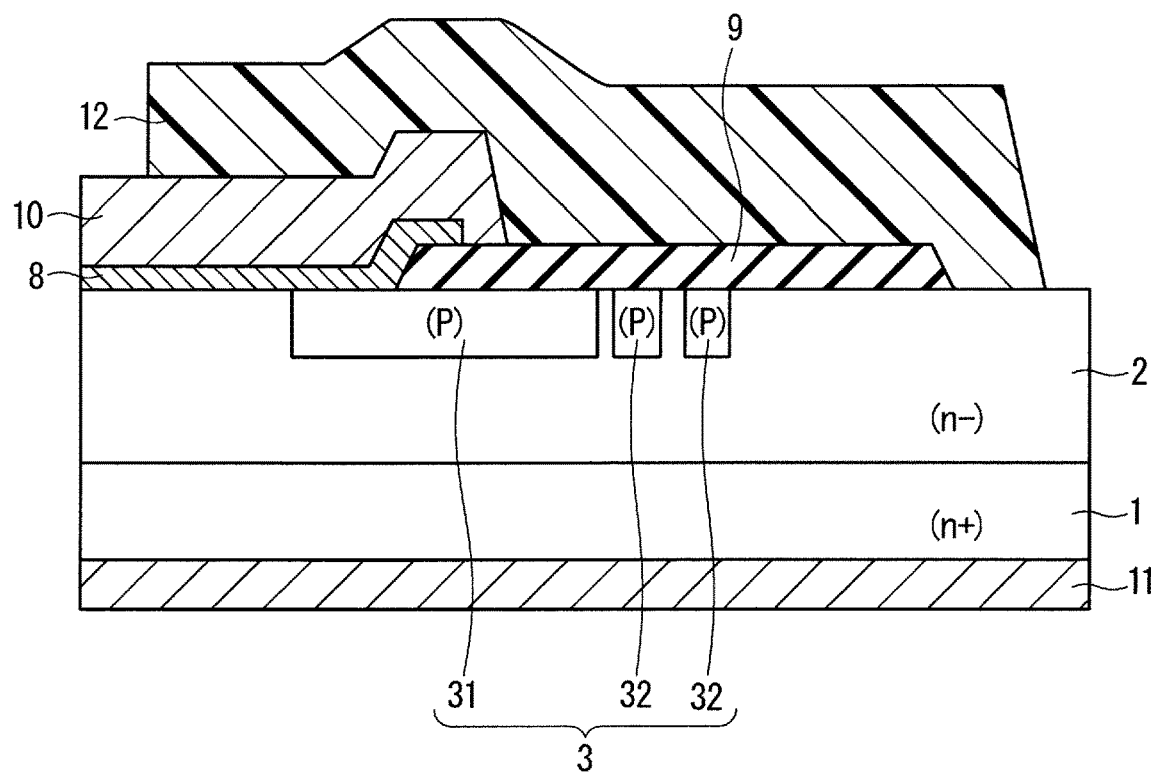
FIG. 1 is a cross-sectional view of a Schottky barrier diode in which a termination region is reduced.

As illustrated in FIG. 1, the Schottky barrier diode 90 includes a SiC substrate 1 (semiconductor substrate) with a thickness of 50 µm to 400 µm, containing n-type impurities at a relatively high concentration ($n^+$), and an epitaxial layer 2 (semiconductor layer) of SiC with a thickness of 3 µm to 100 µm, containing n-type impurities at a relatively low concentration ($n^-$), the epitaxial layer 2 being provided on the SiC substrate 1.

The epitaxial layer 2 is provided in its upper layer portion with selectively impurity regions 31 and 32 each with a thickness of 0.2 µm to 2.0 µm, containing p-type impurities, the impurity regions 31 and 32 constituting an electric field limiting region 3. The electric field limiting region 3 is provided in a termination region of the Schottky barrier diode 90, surrounding an active region of the Schottky barrier diode 90. The impurity region 31 has a larger cross-sectional area than the impurity region 32, and a plurality of the impurity regions 32 is provided outside the impurity region 31 at an interval. The number and a placement interval of the impurity regions 32 are set in accordance with the rating of the Schottky barrier diode 90.

A Schottky electrode 8 is provided on a surface of a portion corresponding to an active region of the epitaxial layer 2. The Schottky electrode 8 is provided to be in contact not only with a surface of the epitaxial layer 2, but also with a part of a front surface of an oxide film protective film 9 (first protective film) with a thickness of 0.5 µm to 3.0 µm, the oxide film protective film 9 being provided on the epitaxial layer 2 in the termination region. The Schottky electrode 8 is made of Mo (molybdenum), Ti (titanium), Ni (nickel), or the like, for example.

The oxide film protective film 9 is provided covering the electric field limiting region 3 using a silicon oxide film made of tetraethyl orthosilicate (TEOS), for example.

In addition, a front surface electrode 10 serving as an anode electrode (first main electrode) is provided covering an inside edge portion of the oxide film protective film 9 from above the Schottky electrode 8, and a back surface electrode 11 (second main electrode) serving as a cathode electrode is provided on a back surface of the SiC substrate 1, the back surface being a main surface opposite to a main surface above which the front surface electrode 10 is provided. The front surface electrode 10 and the back surface electrode 11 are each made of Al (aluminum), copper (Cu), or the like, for example.

Then, a polyimide protective film 12 (second protective film) is provided covering portions above an end edge portion of the front surface electrode 10, the oxide film protective film 9, and a part of the epitaxial layer 2 in the termination region.

In the Schottky barrier diode 90 configured as described above, water contained in the polyimide protective film 12 reacts with the front surface electrode 10 and the SiC layer that are reaction objects due to a high electric field, so that a product such as a hydroxide or an oxide is formed by electrolysis action of the water.

Figure 2:
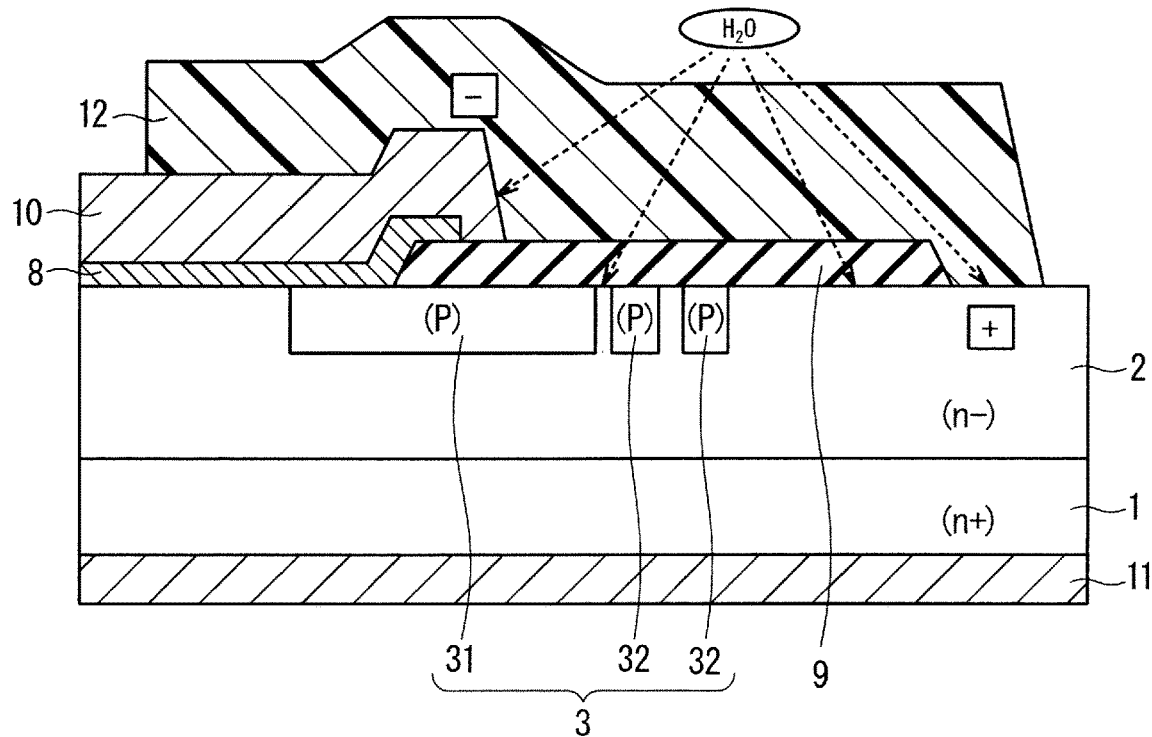
FIG. 2 is a view schematically illustrating a state in which a reverse bias voltage is applied to the Schottky barrier diode.

FIG. 2 is a view schematically illustrating a state in which a reverse bias voltage is applied to the Schottky barrier diode 90. The Schottky barrier diode 90 is biased such that the front surface electrode 10 has a negative potential and the back surface electrode 11 has a positive potential.

In particular, a high voltage due to the reverse bias voltage is applied between an end portion of the surface electrode 10 and the front surface of the epitaxial layer 2 on a device end edge portion side, and the polyimide protective film 12 is likely to absorb water. Thus, products are remarkably formed by electrolysis action of the water ($H_2O$).

Figure 3:
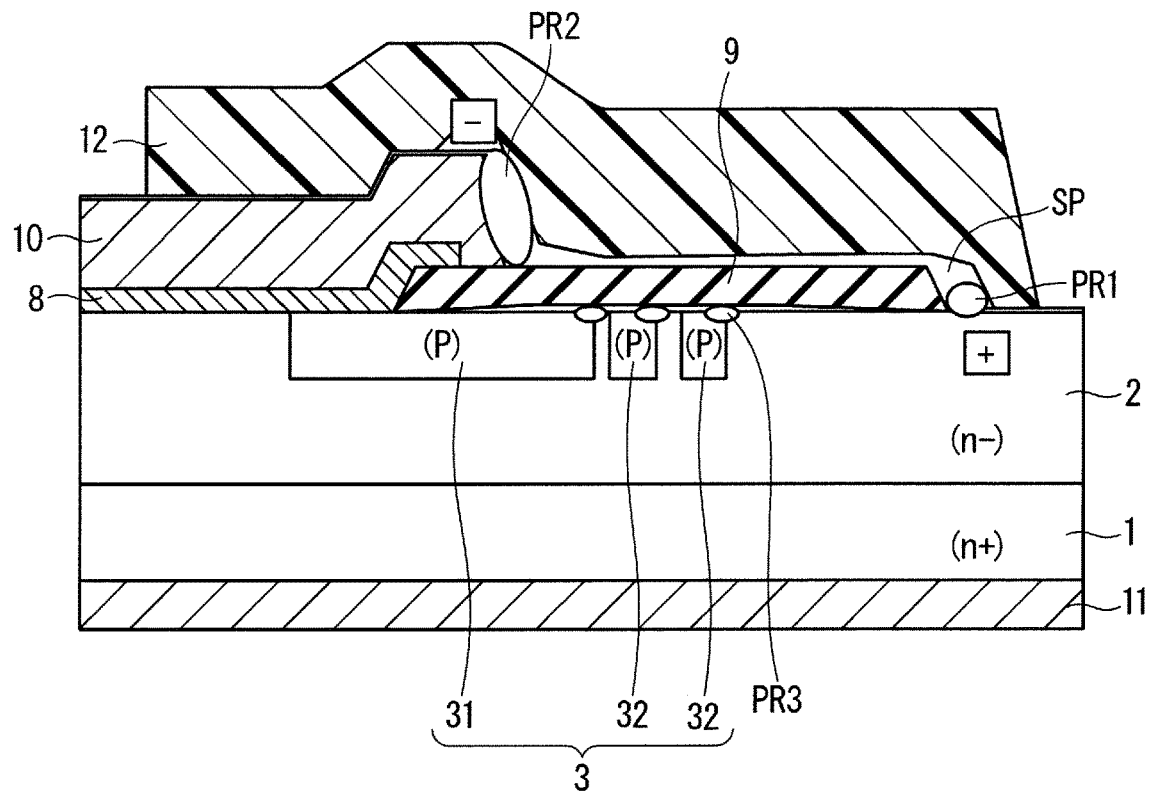
FIG. 3 is a view schematically illustrating a state in which a product is formed on the Schottky barrier diode.

FIG. 3 schematically illustrates a state in which a product PR2 is formed in the end edge portion of the front surface electrode 10, a product PR1 is formed on the surface of the epitaxial layer 2 on the device end edge portion side, and a product PR3 is formed under the oxide film protective film 9 when water passes through the oxide film protective film 9 to reach the front surface of the epitaxial layer 2 under the oxide film protective film 9. While the product PR2 is also formed on an upper surface of the front surface electrode 10, the product PR2 is particularly and remarkably formed on a side surface of the end edge portion. The product PR1 is remarkably formed near the oxide film protective film 9.

When the reaction proceeds to cause the products PR1 and PR2 to expand in volume as illustrated in FIG. 3, the polyimide protective film 12 peels off to generate a void SP between the polyimide protective film 12 and the oxide film protective film 9.

When the polyimide protective film 12 peels off, electric field distribution changes from a peeling portion as a starting point to cause a decrease in withstand voltage, or a defect such as a leak path caused by water accumulating in the void SP. This may cause a failure of the Schottky barrier diode 90.

Electric field strength increases at a p-n junction between the electric field limiting region 3 of a p-type and the epitaxial layer 2 of an n-type, so that a product is remarkably formed as compared with other surface regions of the epitaxial layer 2. When the oxide film protective film 9 peels off due to volume expansion of the product PR3, a failure of the Schottky barrier diode 90 may be caused by the same reason as that when the polyimide protective film 12 peels off.

In view of the mechanism of formation of the products PR1 to PR3 described above, a semiconductor device according to a preferred embodiment of the present invention made by the inventors will be described below.

First Preferred Embodiment

Figure 4:
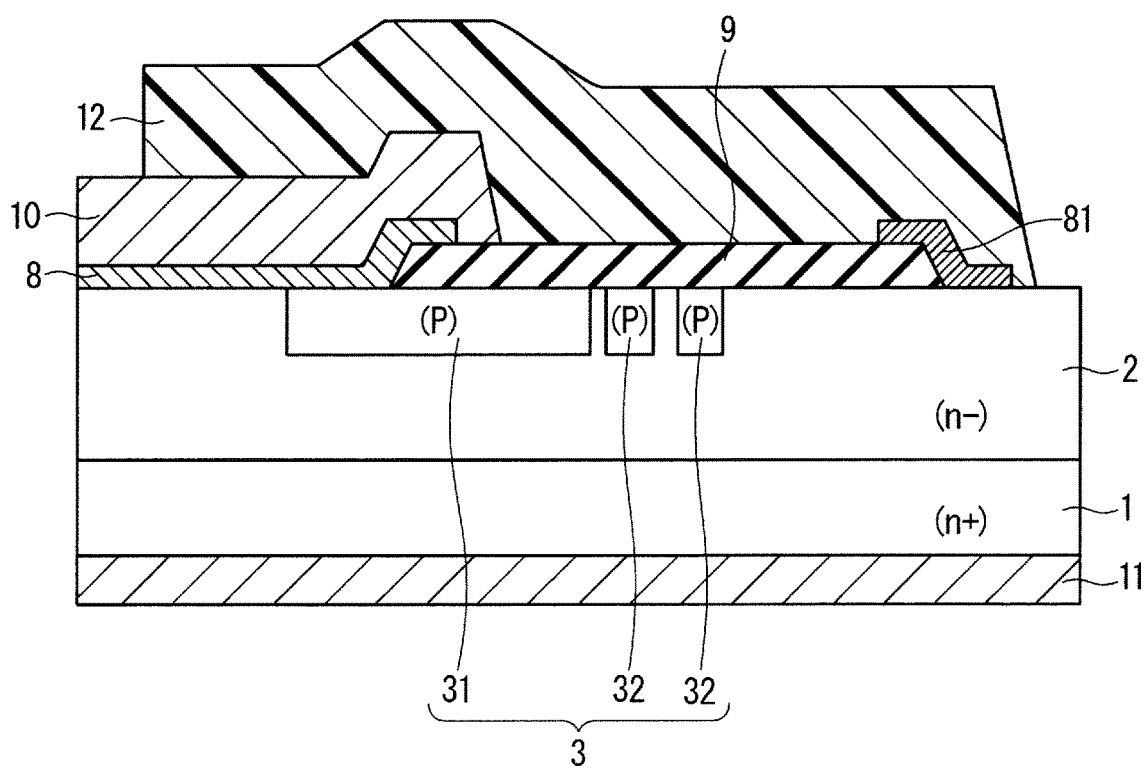
FIG. 4 is a cross-sectional view of a Schottky barrier diode according to a first preferred embodiment of the present invention.

FIG. 4 is a cross-sectional view illustrating a structure of a Schottky barrier diode 100 that is a semiconductor device according to a first preferred embodiment of the present invention. In FIG. 4, the same components as those of the Schottky barrier diode 90 described with reference to FIG. 1 are denoted by the same reference numerals, and duplicated description is eliminated.

The Schottky barrier diode 100 illustrated in FIG. 4 includes a protective metal film 81 provided on a portion from an outside end edge portion of an oxide film protective film 9 to a front surface of an epitaxial layer 2.

The protective metal film 81 is not provided above an electric field limiting region 3 and is provided with not to conduct with a front surface electrode 10. It is desirable that a metal excellent in corrosion resistance such as Mo, Ti, Ni, Au (gold), or the like is used for the protective metal film 81, and that the protective metal film 81 has a thickness of 100 nm or more to prevent an uncovered portion from being formed.

When the Schottky barrier diode 100 is provided with the protective metal film 81, a failure of the Schottky barrier diode 100 is suppressed for long-life by suppressing formation of a product on a front surface of the epitaxial layer 2 on a device end edge portion side to suppress peeling of a polyimide protective film 12 even when a reverse bias voltage is applied, and water enters the inside of the polyimide protective film 12. This means that water resistance is improved.

Figure 5:
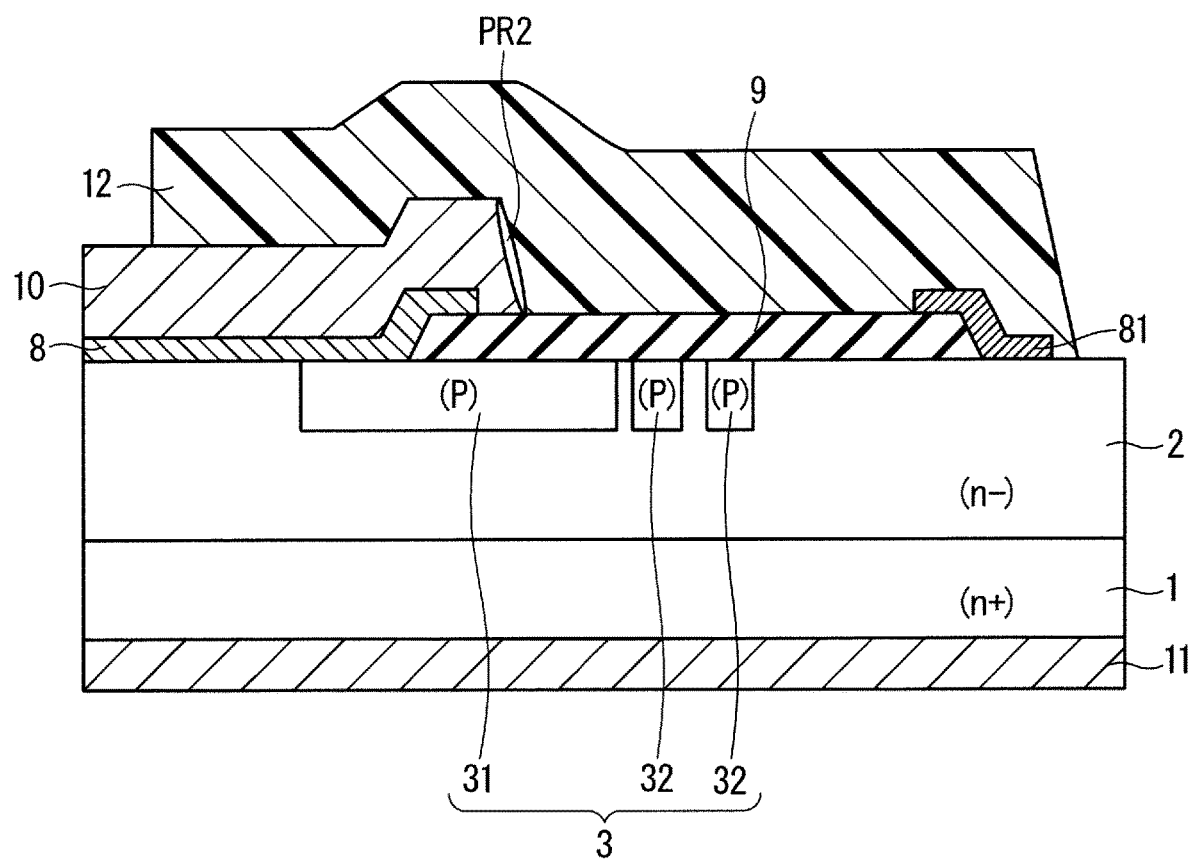
FIG. 5 is a view schematically illustrating a state in which a product is formed on the Schottky barrier diode according to the first preferred embodiment of the present invention.

In addition, suppressing formation of a product on the front surface of the epitaxial layer 2 on the device end edge portion side also suppresses formation of a product on an end edge portion of the front surface electrode 10 opposite in potential. FIG. 5 schematically illustrates that formation of a product PR2 is suppressed on the end edge portion of the front surface electrode 10. The product PR2 is thin and small in volume, so that it does not cause the polyimide protective film 12 to peel off. It is conceivable that the formation of the product PR2 is suppressed because oxygen does not react with the epitaxial layer 2 even when water is electrolyzed once, so that the oxygen is caused to combine again with hydrogen in the polyimide protective film 12 to return to water, thereby suppressing the formation of the product PR2 being a hydroxide on the end edge portion of the front surface electrode 10.

<Application to MOSFET>

While the Schottky barrier diode is described as an example in the first preferred embodiment described above, the semiconductor device according to the first preferred embodiment of the present invention may be a MOSFET.

Figure 6:
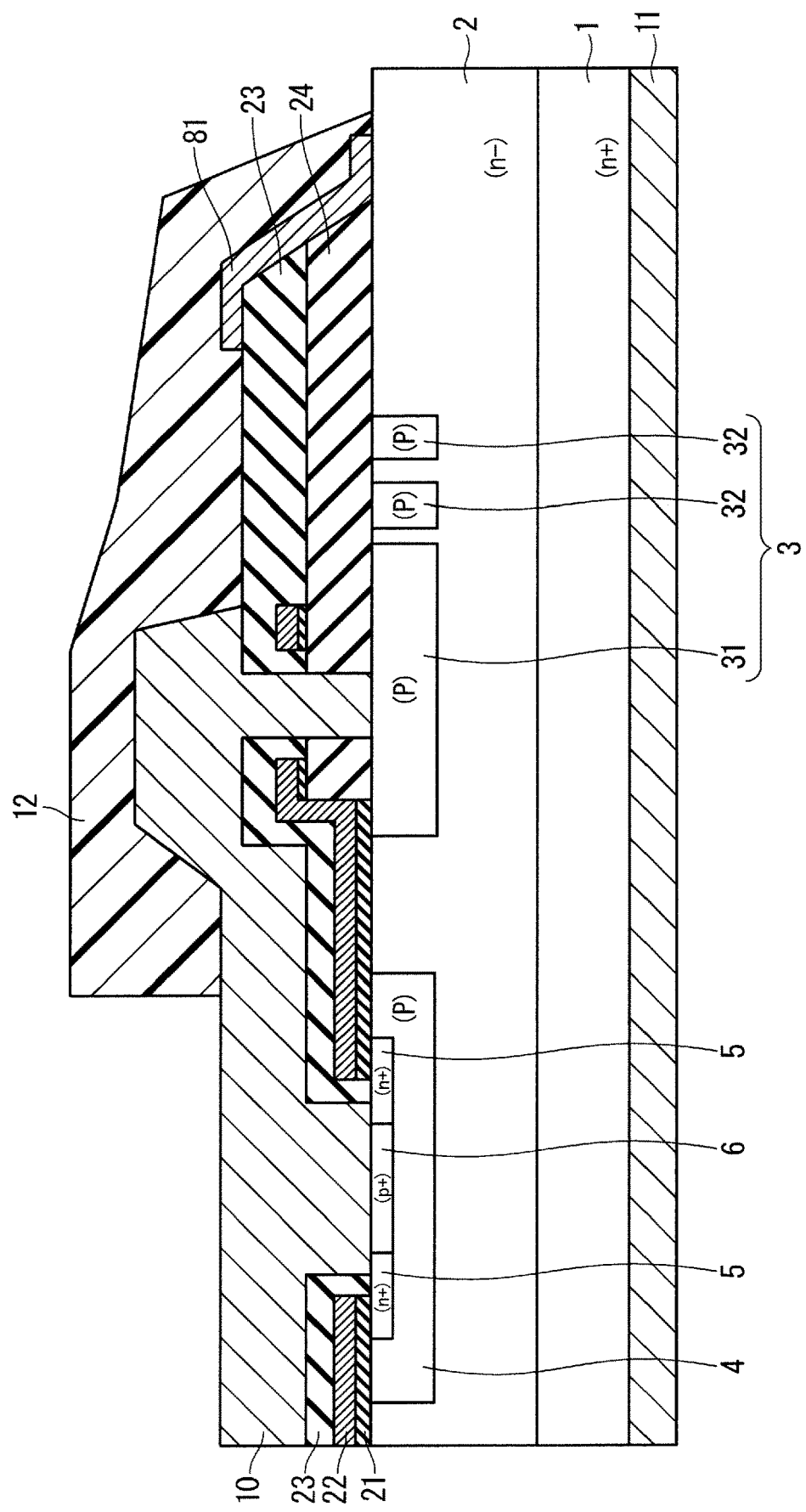
FIG. 6 is a cross-sectional view of a MOSFET according to the first preferred embodiment of the present invention.

FIG. 6 is a cross-sectional view illustrating a structure of a MOSFET 200 that is a semiconductor device according to the first preferred embodiment of the present invention.

As illustrated in FIG. 6, the MOSFET 200 includes a SiC substrate 1 with a thickness of 50 µm to 400 µm, containing n-type impurities at a relatively high concentration ($n^+$), and an epitaxial layer 2 with a thickness of 3 µm to 100 µm, containing n-type impurities at a relatively low concentration ($n^-$), the epitaxial layer 2 being provided on the SiC substrate 1.

The epitaxial layer 2 is provided in its upper layer portion with selectively impurity regions 31 and 32 each with a thickness of 0.2 µm to 2.0 µm, containing p-type impurities, the impurity regions 31 and 32 constituting an electric field limiting region 3. The electric field limiting region 3 is provided in a termination region of the MOSFET 200, surrounding an active region of the MOSFET 200. The impurity region 31 has a larger cross-sectional area than the impurity region 32, and a plurality of the impurity regions 32 is provided outside the impurity region 31 at an interval. The number and a placement interval of the impurity regions 32 are set in accordance with the rating of the MOSFET 200.

The epitaxial layer 2 is provided in its upper layer portion with selectively a well region 4 with a thickness of 0.2 µm to 2.0 µm, containing p-type impurities, in the active region of the MOSFET 200. The well region 4 is provided in its upper layer portion with selectively a well contact region 6 containing p-type impurities at a relatively high concentration ($p^+$), and source regions 5 each containing n-type impurities at a relatively high concentration ($n^+$) are provided across the well contact region 6. The source region 5 and the well contact region 6 are formed having a thickness less than that of the well region 4. While FIG. 6 illustrates only one well region 4, a plurality of the well regions 4 is provided at intervals in the active region, and the well region 4 in FIG. 6 is in an outermost periphery of the active region.

The well contact region 6 is provided to stabilize switching characteristics by causing the source region 5 and the well region 4 to be equal in potential, but the well contact region 6 is not an essential configuration.

On the epitaxial layer 2, an oxide film protective film 24 with a thickness of 0.3 µm to 3.0 µm is provided covering the electric field limiting region 3 from above. The oxide film protective film 24 uses a silicon oxide film made of TEOS, for example.

On the epitaxial layer 2, a gate insulating film 21 with a thickness of 20 nm to 200 nm is also provided covering from a portion between the well regions 4 adjacent to each other (not illustrated) to portions on an end edge portion of the well region 4 and on an end edge portion of the source region 5, and a gate electrode 22 is provided on the gate insulating film 21.

The gate insulating film 21 is also provided covering from a portion on an end edge portion of the source region 5 to portions on an end edge portion of the well region 4, an end edge portion of the impurity region 31, and a part of the oxide film protective film 24. The gate electrode 22 is provided on the gate insulating film 21.

The gate insulating film 21, the gate electrode 22, and the oxide film protective film 24 are covered with an interlayer insulating film 23 with a thickness of 0.3 µm to 3.0 µm, and a front surface electrode 10 serving as a source electrode is provided on portions of the source region 5 and the well contact region 6, not being covered with the interlayer insulating film 23. A laminated film of the oxide film protective film 24 and the interlayer insulating film 23 may be called a protective film (first protective film).

The front surface electrode 10 is provided with a portion in a termination region, passing through the interlayer insulating film 23 and the oxide film protective film 24 to reach the impurity region 31.

Then, a polyimide protective film 12 is provided covering portions on an end edge portion of the front surface electrode 10, the interlayer insulating film 23, and a part of the epitaxial layer 2 in the termination region.

On a back surface of the SiC substrate 1, opposite to the front surface electrode 10, a back surface electrode 11 serving as s drain electrode is provided. The front surface electrode 10 and the back surface electrode 11 are each made of Al, Cu, or the like, for example.

Then, a protective metal film 81 is provided on a portion from an end edge portion of the laminated oxide film protective film 24 and interlayer insulating film 23 to a front surface of the epitaxial layer 2.

The protective metal film 81 is not provided above the electric field limiting region 3 and is provided with not to conduct with the front surface electrode 10. It is desirable that a metal excellent in corrosion resistance such as Mo, Ti, Ni, Au, or the like is used for the protective metal film 81, and that the protective metal film 81 has a thickness of 100 nm or more to prevent an uncovered portion from being formed.

When the MOSFET 200 is provided with the protective metal film 81, a failure of the MOSFET 200 is suppressed for long-life by suppressing formation of a product on a front surface of the epitaxial layer 2 on a device end edge portion side to suppress peeling of the polyimide protective film 12 even when a forward bias voltage is applied, and water enters the inside of the polyimide protective film 12. This means that water resistance is improved. In addition, suppressing formation of a product on the front surface of the epitaxial layer 2 on the device end edge portion side also suppresses formation of a product on an end edge portion of the front surface electrode 10 opposite in potential.

The state in which the forward bias voltage is applied in the MOSFET 200 means that the MOSFET 200 is biased such that the front surface electrode 10 serving as a source electrode has a negative potential and the back surface electrode 11 serving as a drain electrode has a positive potential.

<First Modification>

Figure 7:
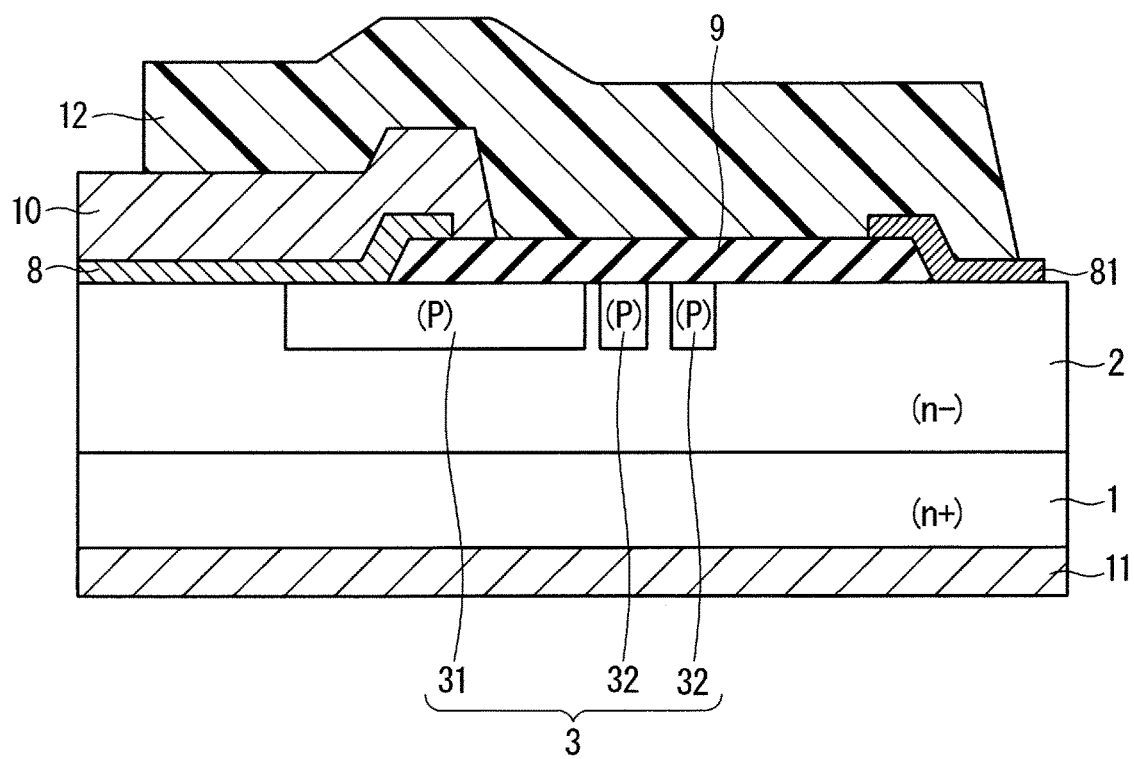
FIGS. 7 and 8 are cross-sectional views of modifications of the Schottky barrier diode according to the first preferred embodiment of the present invention.

While the Schottky barrier diode 100 illustrated in FIG. 4 is configured such that the protective metal film 81 is provided on the portion from the outside end edge portion of the oxide film protective film 9 to the front surface of the epitaxial layer 2 to allow the protective metal film 81 to be completely covered with the polyimide protective film 12, the protective metal film 81 may be provided with an outside end edge portion extending to near a device end portion, the protective metal film 81 being not completely covered with a polyimide protective film 12, and the outside end edge portion of the protective metal film 81 may be positioned outward of an outside end edge portion of the polyimide protective film 12, as in a Schottky barrier diode 100A illustrated in FIG. 7.

Disposing the protective metal film 81 as described above causes the polyimide protective film 12 not to be brought into contact with the surface of the epitaxial layer 2, so that formation of a product on a contact surface between the polyimide protective film 12 and the epitaxial layer 2 is suppressed as much as possible to suppress peeling of the polyimide protective film 12, thereby enabling further improvement in water resistance.

<Second Modification>

Figure 8:
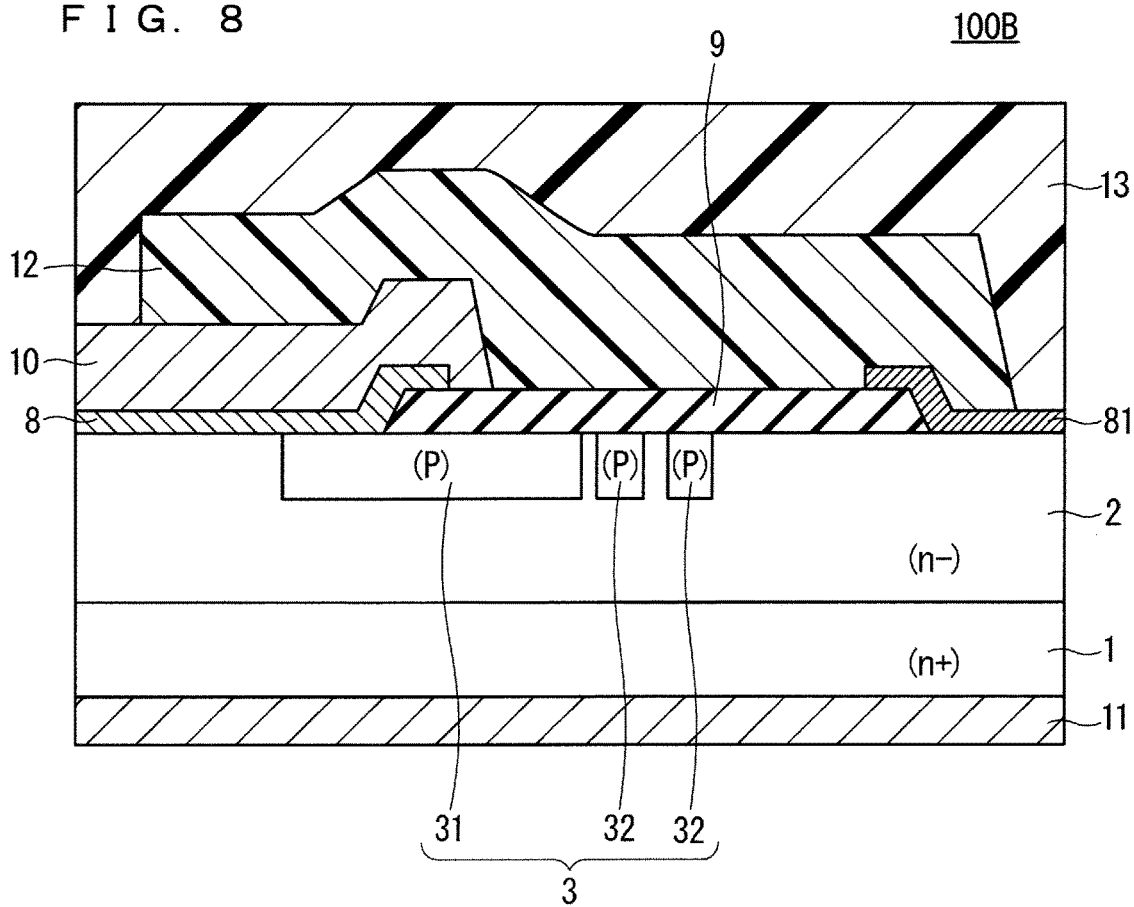

While the Schottky barrier diode 100 illustrated in FIG. 4 is configured such that the protective metal film 81 is provided on the portion from the outside end edge portion of the oxide film protective film 9 to the front surface of the epitaxial layer 2 to allow the protective metal film 81 to be completely covered with the polyimide protective film 12, the protective metal film 81 may be provided with an outside end edge portion extending to a device end portion, i.e., a most-end portion of the epitaxial layer 2, as in a Schottky barrier diode 100B illustrated in FIG. 8.

When the structure as described above is used in a structure in which the polyimide protective film 12 is covered with even a sealing material 13 having a hygroscopic property, formation of a product on a contact surface between the sealing material 13 and the epitaxial layer 2 is suppressed by preventing the sealing material 13 from being brought into contact with the surface of the epitaxial layer 2 to suppress peeling of the sealing material 13, thereby enabling further improvement in water resistance.

Second Preferred Embodiment

Figure 9:
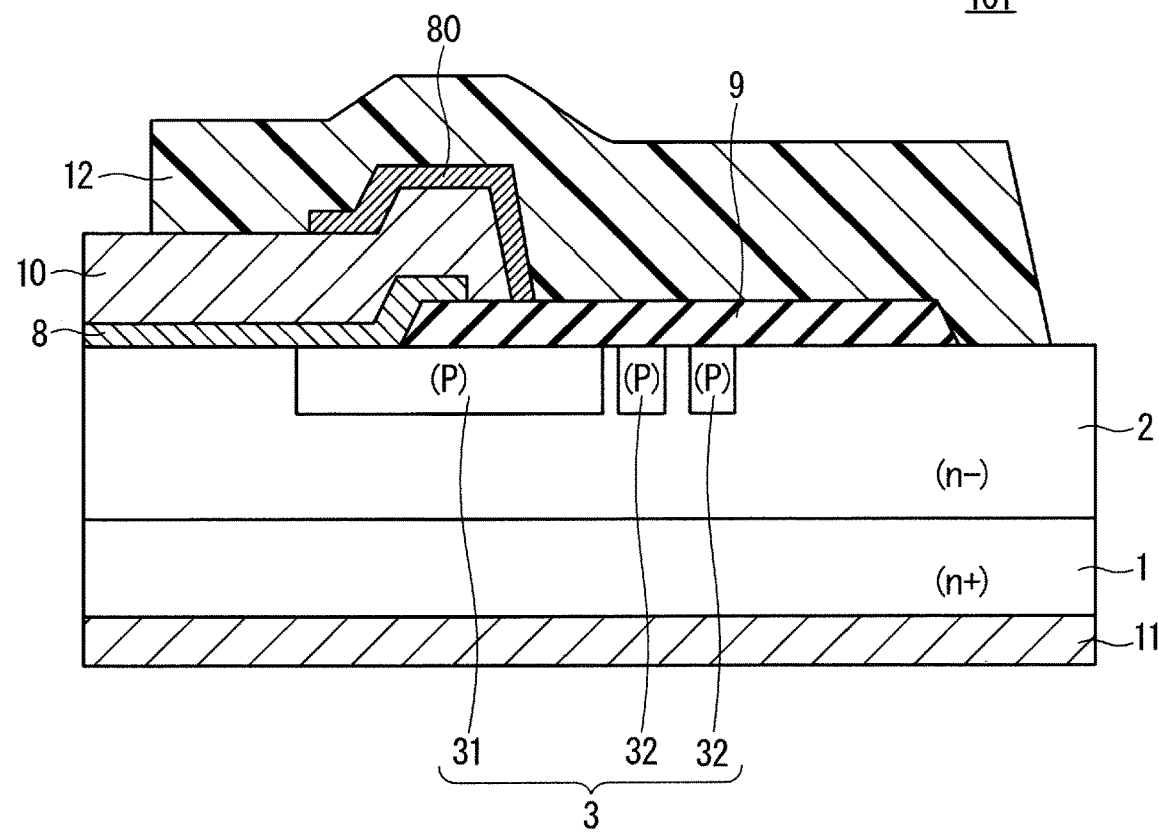
FIG. 9 is a cross-sectional view of a Schottky barrier diode according to a second preferred embodiment of the present invention.

FIG. 9 is a cross-sectional view illustrating a structure of a Schottky barrier diode 101 that is a semiconductor device according to a second preferred embodiment of the present invention. In FIG. 9, the same components as those of the Schottky barrier diode 90 described with reference to FIG. 1 are denoted by the same reference numerals, and duplicated description is eliminated.

The Schottky barrier diode 101 illustrated in FIG. 9 includes a protective metal film 80 provided on an end edge portion of a front surface electrode 10. A polyimide protective film 12 is provided from an upper surface of an end edge portion of the protective metal film 80 to a side surface thereof, but is not provided on an electric field limiting region 3.

It is desirable that a metal excellent in corrosion resistance such as Mo, Ti, Ni, Au, or the like is used for the protective metal film 81, and that the protective metal film 81 has a thickness of 100 nm or more to prevent an uncovered portion from being formed.

When the Schottky barrier diode 101 is provided with the protective metal film 80, a failure of the Schottky barrier diode 101 is suppressed to improve water resistance thereof by suppressing formation of a product on the end edge portion of the front surface electrode 10 to suppress peeling of the polyimide protective film 12 even when a reverse bias voltage is applied, and water enters the inside of the polyimide protective film 12.

In addition, suppressing formation of a product on the end edge portion of the front surface electrode 10 also suppresses formation of a product on a front surface of an epitaxial layer 2 on a device end edge portion side, opposite in potential.

Figure 10:
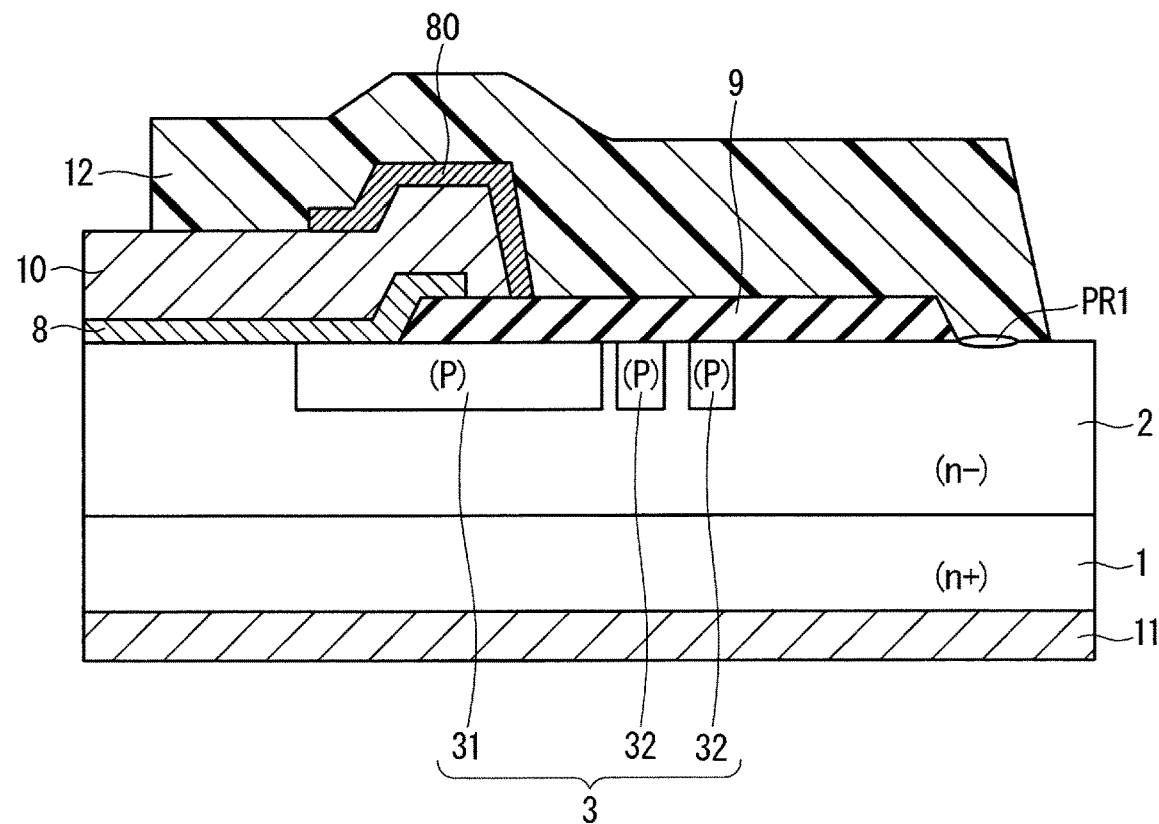
FIG. 10 is a view schematically illustrating a state in which a product is formed on the Schottky barrier diode according to the second preferred embodiment of the present invention.

FIG. 10 schematically illustrates that formation of a product PR1 is suppressed on a front surface of the epitaxial layer 2 on the device end edge portion side. The product PR1 is thin and small in volume, so that it does not cause the polyimide protective film 12 to peel off. It is conceivable that the formation of the product PR1 is suppressed because hydroxyl groups ($OH^-$) does not react with the front surface electrode 10 even when water is electrolyzed once, so that the oxygen is caused to combine again with hydrogen in the polyimide protective film 12 to return to water, thereby suppressing the formation of the product PR1 being an oxide on the front surface of the epitaxial layer 2 on the device end edge portion side.

<First Modification>

Figure 11:
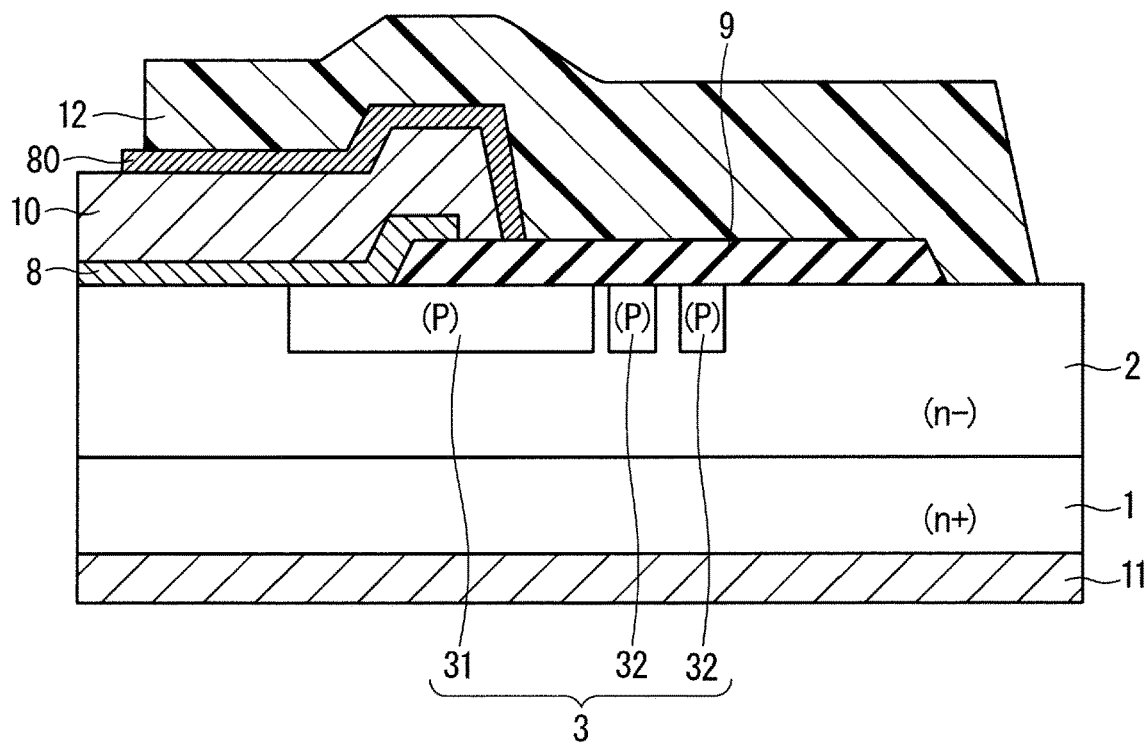
FIGS. 11 and 12 are cross-sectional views of modifications of the Schottky barrier diode according to the second preferred embodiment of the present invention.

While the Schottky barrier diode 101 illustrated in FIG. 9 is configured such that the protective metal film 80 is provided from the upper surface of the end edge portion of the front surface electrode 10 to the side surface thereof to allow the protective metal film 80 to be completely covered with the polyimide protective film 12, the protective metal film 80 may be provided with an inside end edge portion positioned inward of an inside end edge portion of the polyimide protective film 12 in a device so that the protective metal film 80 is not completely covered with the polyimide protective film 12, as in a Schottky barrier diode 101A illustrated in FIG. 11.

Disposing the protective metal film 80 as described above causes the polyimide protective film 12 not to be brought into contact with the upper surface of front surface electrode 10, so that formation of a product on a contact surface between the polyimide protective film 12 and the front surface electrode 10 is suppressed as much as possible to suppress peeling of the polyimide protective film 12, thereby enabling further improvement in water resistance.

<Second Modification>

Figure 12:
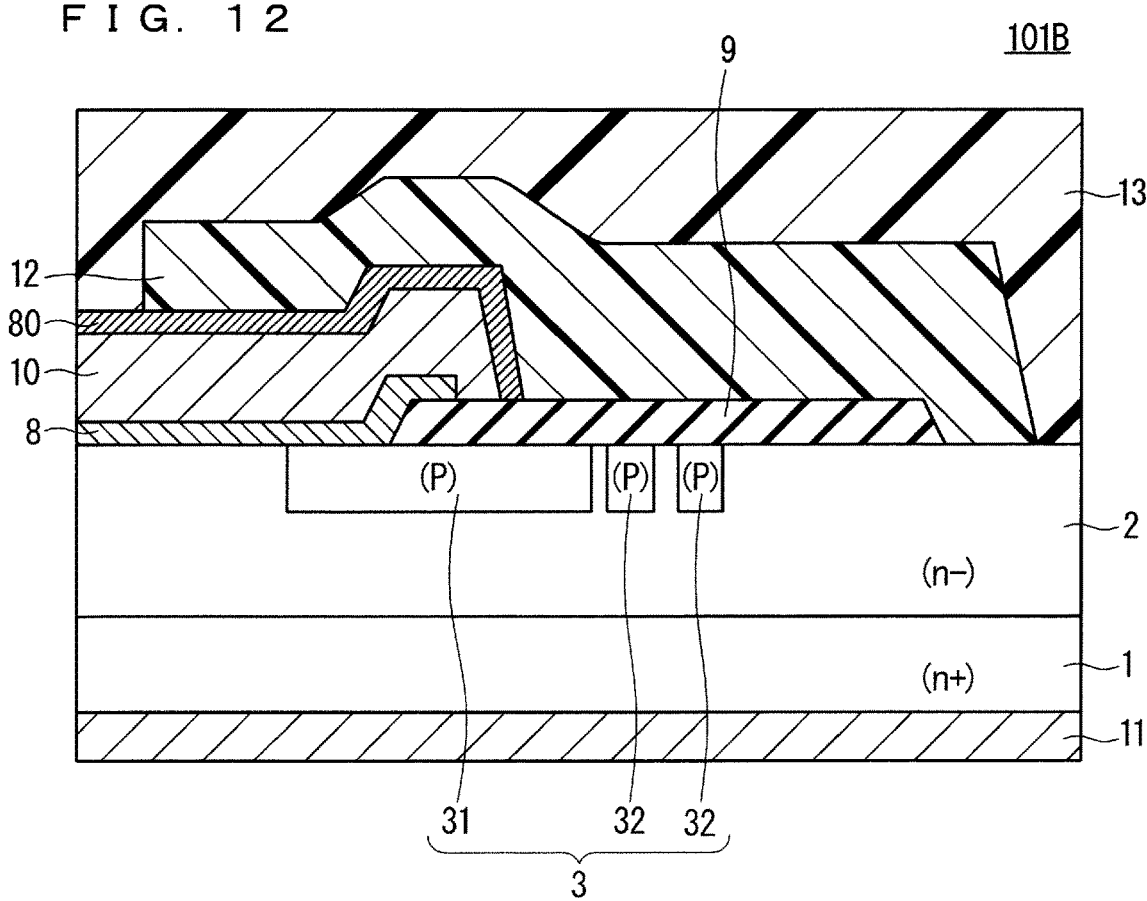

While the Schottky barrier diode 101 illustrated in FIG. 9 is configured such that the protective metal film 80 is provided from the upper surface of the end edge portion of the front surface electrode 10 to the side surface thereof to allow the protective metal film 80 to be completely covered with the polyimide protective film 12, the protective metal film 80 may be provided covering the entire upper surface of the front surface electrode 10 and the protective metal film 80 is not completely covered with the polyimide protective film 12, as in a Schottky barrier diode 101B illustrated in FIG. 12.

When the structure as described above is used in a structure in which the polyimide protective film 12 is covered with even a sealing material 13 having a hygroscopic property, formation of a product on a contact surface between the sealing material 13 and the front surface electrode 10 is suppressed by preventing the sealing material 13 from being brought into contact with the upper surface of the front surface electrode 10 to suppress peeling of the sealing material 13, thereby enabling further improvement in water resistance.

Third Preferred Embodiment

Figure 13:
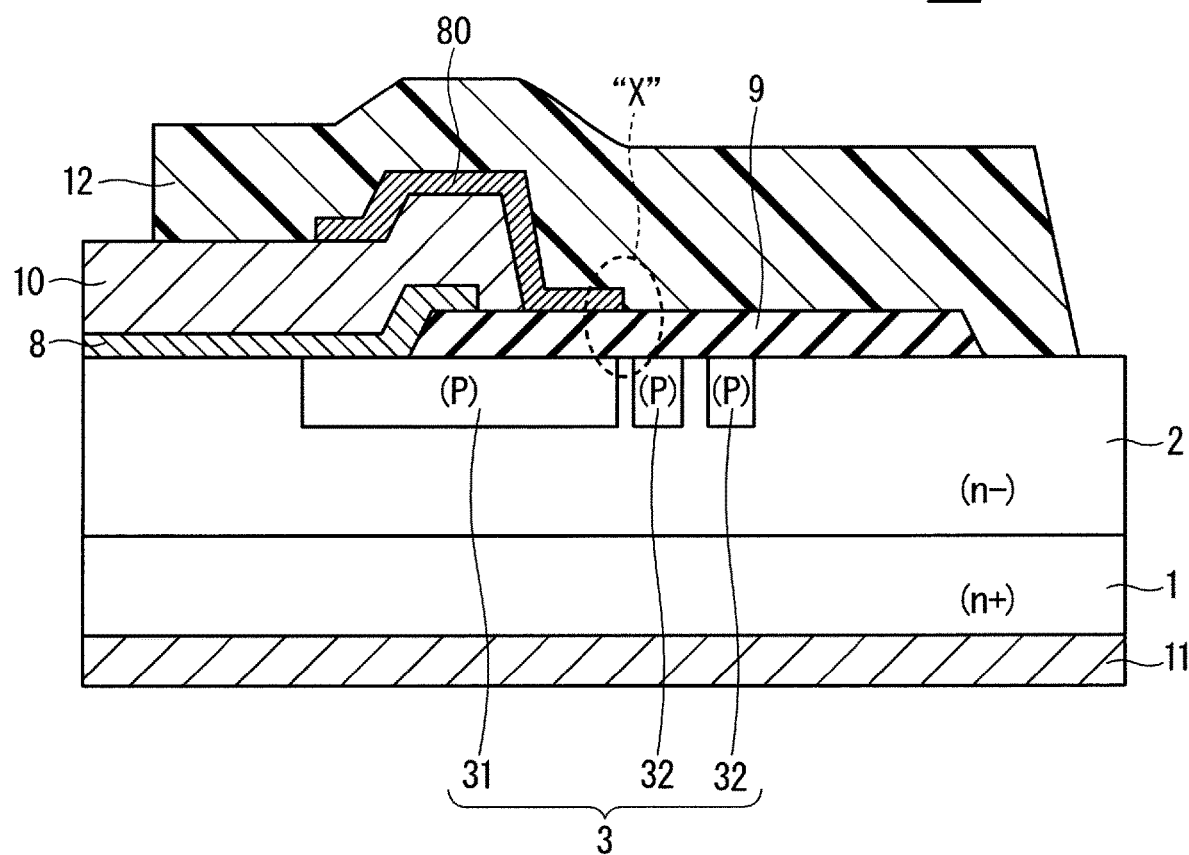
FIG. 13 is a cross-sectional view of a Schottky barrier diode according to a third preferred embodiment of the present invention.

FIG. 13 is a cross-sectional view illustrating a structure of a Schottky barrier diode 102 that is a semiconductor device according to a third preferred embodiment of the present invention. In FIG. 13, the same components as those of the Schottky barrier diode 90 described with reference to FIG. 1 are denoted by the same reference numerals, and duplicated description is eliminated.

While the Schottky barrier diode 102 illustrated in FIG. 13 is the same as the Schottky barrier diode 101 of the second preferred embodiment in that a protective metal film 80 is provided on an end edge portion of a front surface electrode 10, the protective metal film 80 has an outside end edge portion extending to above a position exceeding an outside end edge portion of the innermost impurity region 31 of an electric field limiting region 3 with an oxide film protective film 9 interposed therebetween.

As described above, the p-n junction between the impurity region 31 of the electric field limiting region 3 and an epitaxial layer 2 has a high electric field, so that a product is formed when water passes through the oxide film protective film 9 to reach a front surface of the epitaxial layer 2. However, when the protective metal film 80 has the outside end edge portion extending to above the p-n junction as described above, a depletion layer of the epitaxial layer 2 is extended by field plate effect of the protective metal film 80 to reduce electric field strength at the p-n junction between the impurity region 31 and the epitaxial layer 2.

Figure 14:
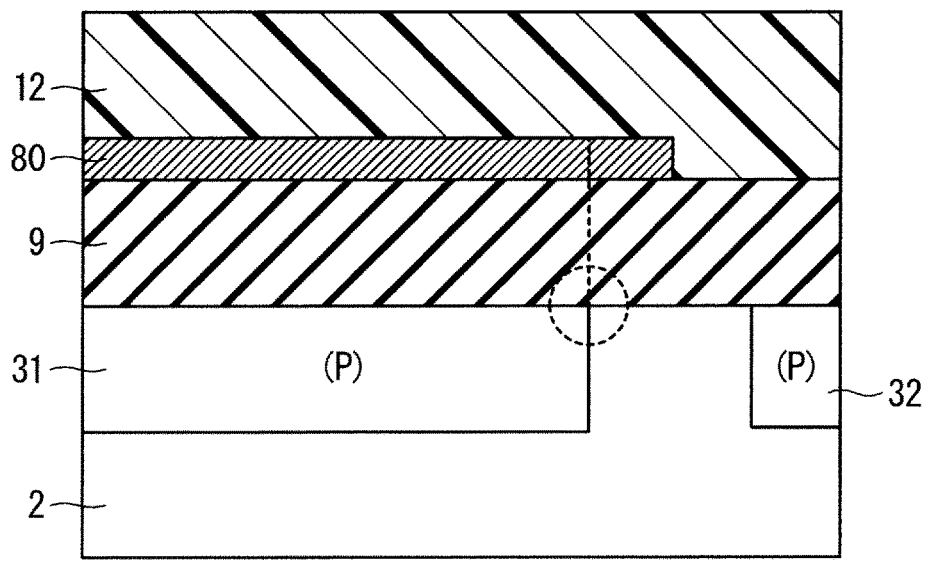
FIG. 14 is a partial cross-sectional view of the Schottky barrier diode according to the third preferred embodiment of the present invention.

FIG. 14 is a partial enlarged view of a region "X" illustrated in FIG. 13, and the p-n junction between the impurity region 31 and the epitaxial layer 2 surrounded by a broken line in FIG. 14 has a high electric field when a reverse bias is applied. However, when the protective metal film 80 has the outside end edge portion extending to above the p-n junction as illustrated in FIG. 14, electric field strength can be reduced.

When a p-type impurity region is provided in an upper layer portion of an n-type substrate, and a plate made of metal is provided on a substrate with an insulating film interposed therebetween to allow a part of the plate to be positioned above the p-n junction between the substrate and the impurity region, electrons are attracted to a surface of the substrate to shrink the depletion layer when a positive bias is applied to the plate on the substrate, due to the field plate effect. Meanwhile, when a negative bias is applied to the plate on the substrate, electrons are expelled from the surface of the substrate, and the depletion layer expands, spreading on the surface of the substrate. When the depletion layer expands to reduce electric field strength at an end edge portion of the impurity region, the withstand voltage can be increased. This is the field plate effect. In the Schottky barrier diode 102 to which the reverse bias is applied, the front surface electrode 10 has a negative potential, so that the protective metal film 80 has a negative potential to serve as a field plate.

When the protective metal film 80 has the outside end edge portion extending to above a position exceeding the outside end edge portion of the impurity region 31 of the electric field limiting region 3 with the oxide film protective film 9 interposed therebetween, water can be prevented from passing through the oxide film protective film 9 to reach the surface of the epitaxial layer 2. As a result, formation of a product is suppressed to suppress peeling of the oxide film protective film 9, so that water resistance can be further improved.

Even in the Schottky barrier diode 101A described with reference to FIG. 11, and the Schottky barrier diode 102A described with reference to FIG. 12, the protective metal film 80 may be provided having an outside end edge portion extending to above a position exceeding the outside end edge portion of the innermost impurity region 31 of the electric field limiting region 3 with the oxide film protective film 9 interposed therebetween. In this case, the effect of reducing the electric field strength at the p-n junction between the impurity region 31 and the epitaxial layer 2 is added.

Fourth Preferred Embodiment

Figure 15:
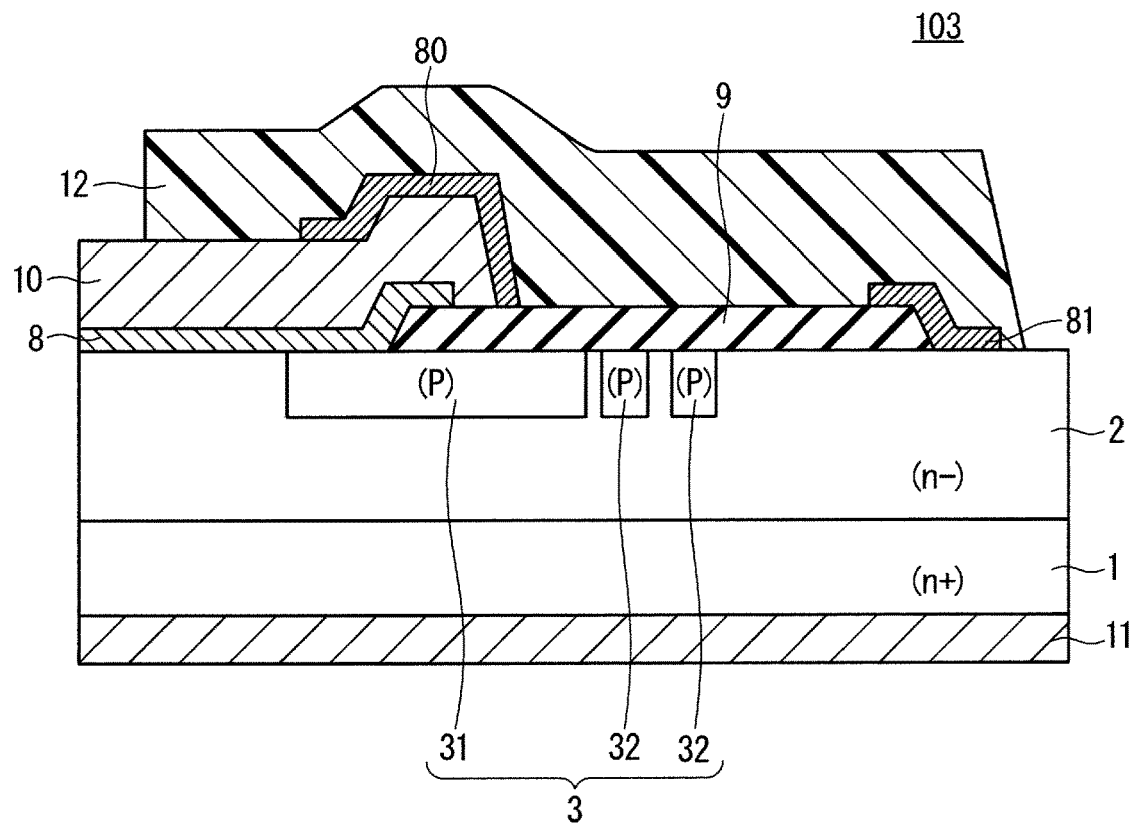
FIG. 15 is a cross-sectional view of a Schottky barrier diode according to a fourth preferred embodiment of the present invention.

FIG. 15 is a cross-sectional view illustrating a structure of a Schottky barrier diode 103 that is a semiconductor device according to a fourth preferred embodiment of the present invention. In FIG. 15, the same components as those of the Schottky barrier diode 90 described with reference to FIG. 1 are denoted by the same reference numerals, and duplicated description is eliminated.

While the Schottky barrier diode 103 illustrated in FIG. 15 is the same as the Schottky barrier diode 101 of the second preferred embodiment in that a protective metal film 80 (second protective metal film) is provided on an end edge portion of a front surface electrode 10, a protective metal film 81 is provided on a portion from an outside end edge portion of an oxide film protective film 9 to a front surface of an epitaxial layer 2.

The protective metal film 81 (first protective metal film) is not provided above the electric field limiting region 3, and is provided with not to conduct with the front surface electrode 10.

The Schottky barrier diode 103 is provided with the protective metal film 80 and the protective metal film 81, a failure of the Schottky barrier diode 103 is suppressed to improve water resistance thereof by suppressing formation of a product on the end edge portion of the front surface electrode 10 and formation of a product on the surface of the epitaxial layer 2 on a device end edge portion side to suppress peeling of a polyimide protective film 12 even when a reverse bias voltage is applied, and water enters the inside of the polyimide protective film 12.

As compared with the first to third preferred embodiments in each of which only one of the protective metal film 80 and the protective metal film 81 is provided, the effect of suppressing the formation of the product is further enhanced.

Fifth Preferred Embodiment

Figure 16:
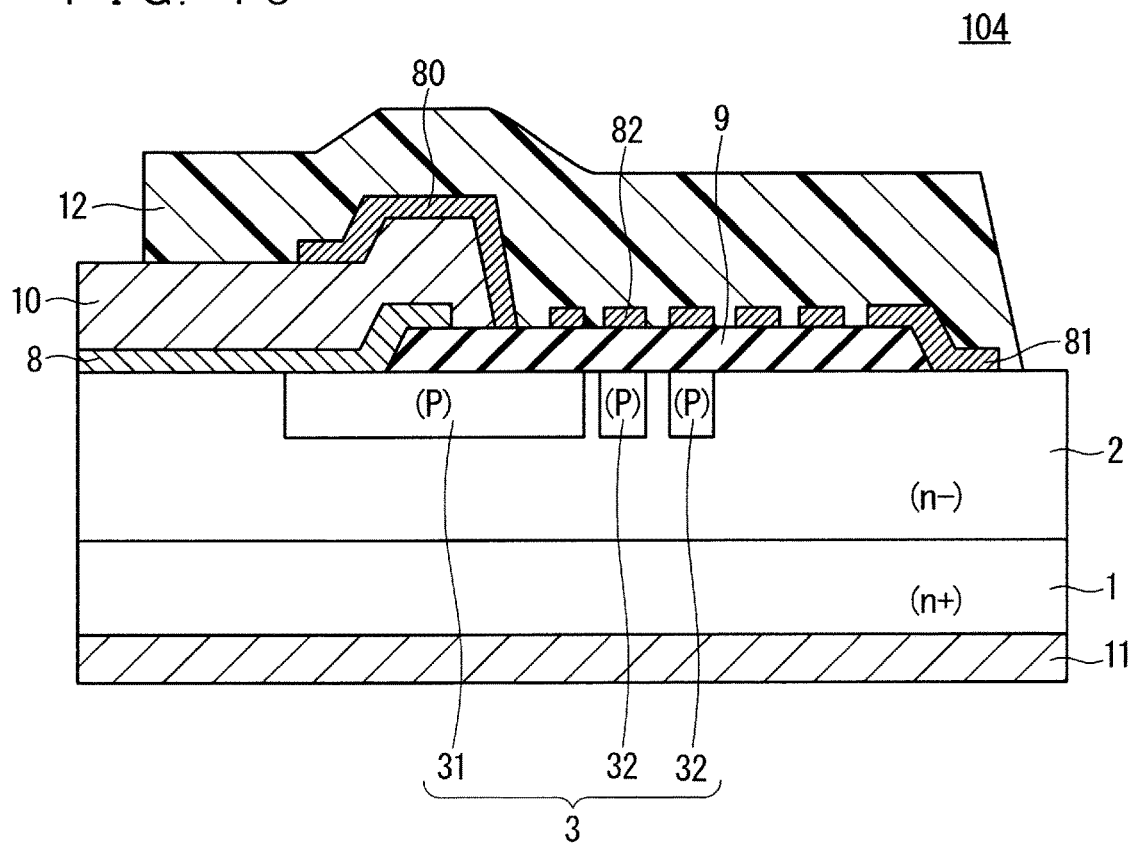
FIG. 16 is a cross-sectional view of a Schottky barrier diode according to a fifth preferred embodiment of the present invention.

FIG. 16 is a cross-sectional view illustrating a structure of a Schottky barrier diode 104 that is a semiconductor device according to a fifth preferred embodiment of the present invention. In FIG. 16, the same components as those of the Schottky barrier diode 90 described with reference to FIG. 1 are denoted by the same reference numerals, and duplicated description is eliminated.

While the Schottky barrier diode 104 illustrated in FIG. 16 is the same as the Schottky barrier diode 103 of the fourth preferred embodiment in that a protective metal film 80 (second protective metal film) and a protective metal film 81 (first protective metal film) are provided, a plurality of protective metal films 82 (third protective metal films) is provided on an upper surface of an oxide film protective film 9 at intervals.

The plurality of protective metal films 82 is provided such that at least some of them are positioned above impurity regions 31 and 32 of an electric field limiting region 3, and is provided with not to conduct with a front surface electrode 10.

When the Schottky barrier diode 104 is provided with the protective metal film 80 and the protective metal film 81, a failure of the Schottky barrier diode 104 is suppressed to further improve water resistance thereof by suppressing formation of a product on an end edge portion of the front surface electrode 10 and formation of a product on a front surface of an epitaxial layer 2 on a device end edge portion side to suppress peeling of a polyimide protective film 12 even when a reverse bias voltage is applied, and water enters the inside of the polyimide protective film 12.

When the protective metal films 82 are provided on the oxide film protective film 9, water can be prevented from passing through the oxide film protective film 9 to reach the front surface of the epitaxial layer 2. As a result, formation of a product is suppressed to suppress peeling of the oxide film protective film 9, so that water resistance can be further improved.

When the plurality of protective metal films 82 is disposed at intervals, increase in electric field strength at an end edge portion of each of the protective metal films 82 can be suppressed.

<Application to MOSFET>

While the Schottky barrier diode is described as an example in the fifth preferred embodiment described above, the semiconductor device according to the fifth preferred embodiment of the present invention may be a MOSFET.

Figure 17:
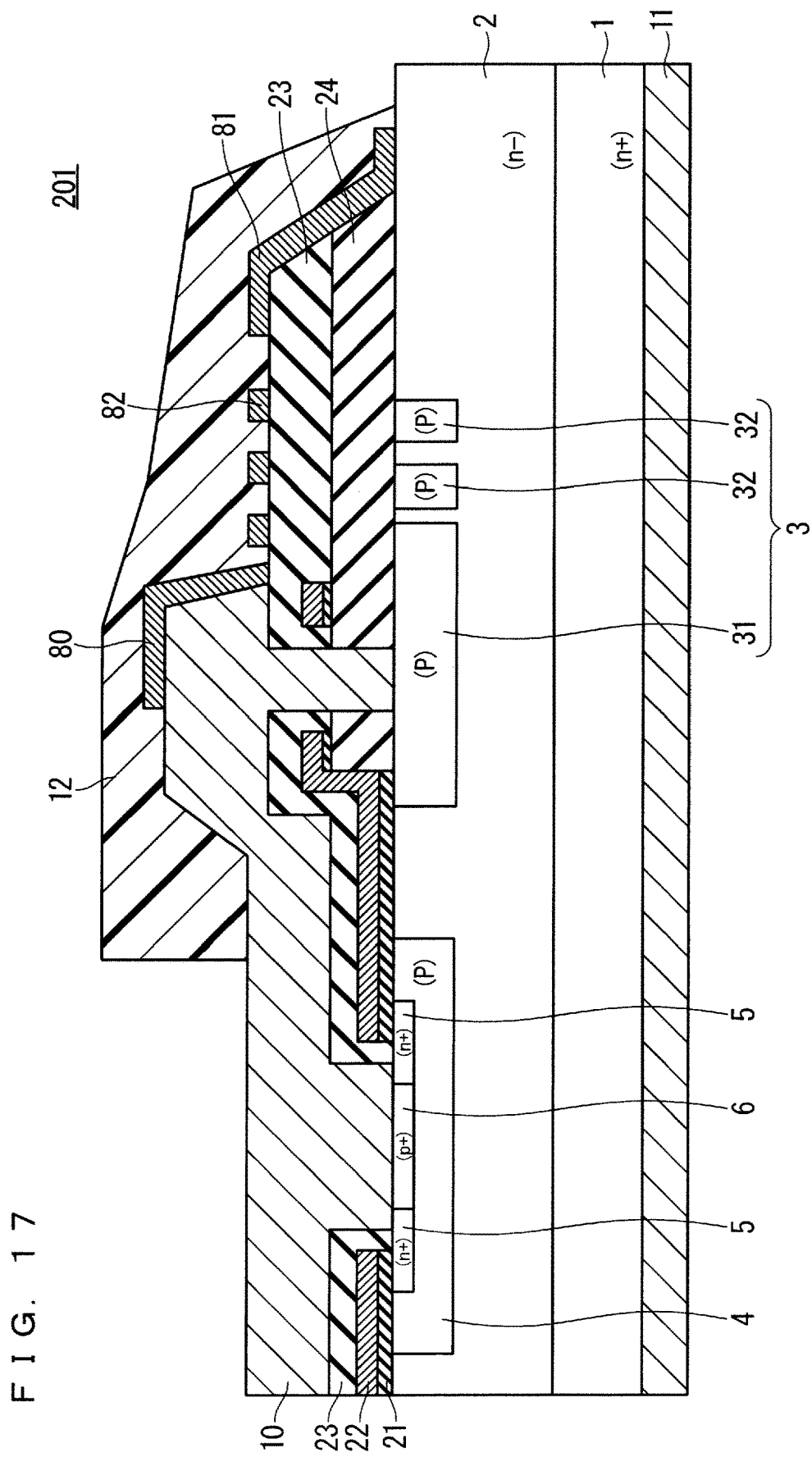
FIG. 17 is a cross-sectional view of a MOSFET according to the fifth preferred embodiment of the present invention.

FIG. 17 is a cross-sectional view illustrating a structure of a MOSFET 201 that is a semiconductor device according to the fifth preferred embodiment of the present invention. In FIG. 17, the same components as those of the MOSFET 200 described with reference to FIG. 6 are denoted by the same reference numerals, and duplicated description is eliminated.

As illustrated in FIG. 17, the MOSFET 201 is configured such that a protective metal film 81 is provided on a portion from an end edge portion of each of an oxide film protective film 24 and an interlayer insulating film 23 that are laminated, to a front surface of an epitaxial layer 2, and that a protective metal film 80 is provided from an upper surface of an end edge portion of a front surface electrode 10 to a side surface thereof.

In addition, a plurality of protective metal films 82 is provided on an upper surface of the interlayer insulating film 23 at intervals. Each of the protective metal films 82 is provided positioned above the corresponding one of impurity regions 31 and 32 of an electric field limiting region 3, and is provided with not to conduct with the front surface electrode 10.

When the MOSFET 201 is provided with the protective metal film 80 and the protective metal film 81, a failure of the MOSFET 201 is suppressed to further improve water resistance thereof by suppressing formation of a product on the end edge portion of the front surface electrode 10 and formation of a product on the surface of the epitaxial layer 2 on a device end edge portion side to suppress peeling of the polyimide protective film 12 even when water enters the inside of the polyimide protective film 12 while a forward bias voltage is applied.

When the protective metal films 82 are provided on an upper surface of the interlayer insulating film 23, water can be prevented from passing through a laminated film of the oxide film protective film 24 and the interlayer insulating film 23 to reach the surface of the epitaxial layer 2. As a result, formation of a product is suppressed to suppress peeling of the oxide film protective film 9, so that water resistance can be further improved.

<Modification>

Figure 18:
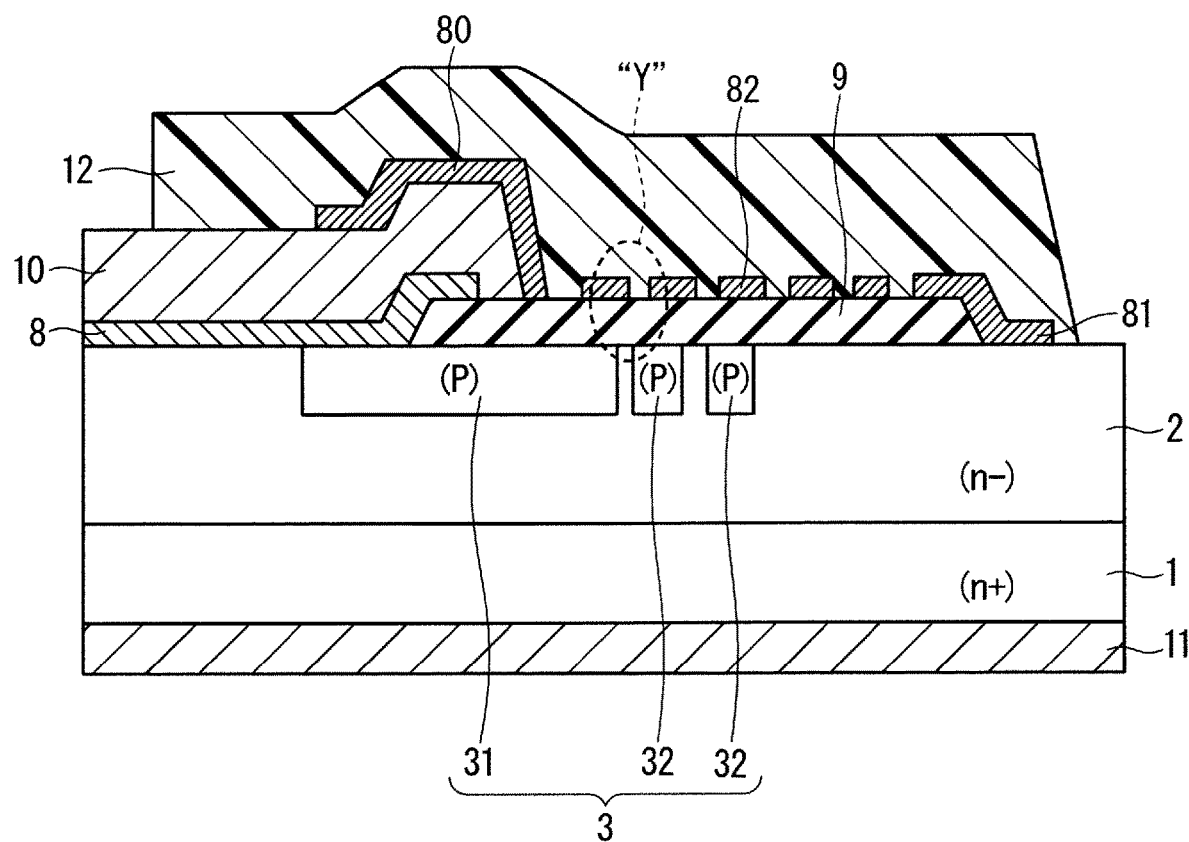
FIG. 18 is a cross-sectional view of a modification of the Schottky barrier diode according to the fifth preferred embodiment of the present invention.

While the fifth preferred embodiment above describes the plurality of protective metal films 82 that is provided positioned above the impurity regions 31 and 32 of the electric field limiting region 3, a protective metal film 82 may be provided having an outside end edge portion extending to a position exceeding an outside end edge portion of impurity regions 31 and 32 of an electric field limiting region 3, with an oxide film protective film 9 interposed therebetween, as in a Schottky barrier diode 104A illustrated in FIG. 18.

Figure 19:
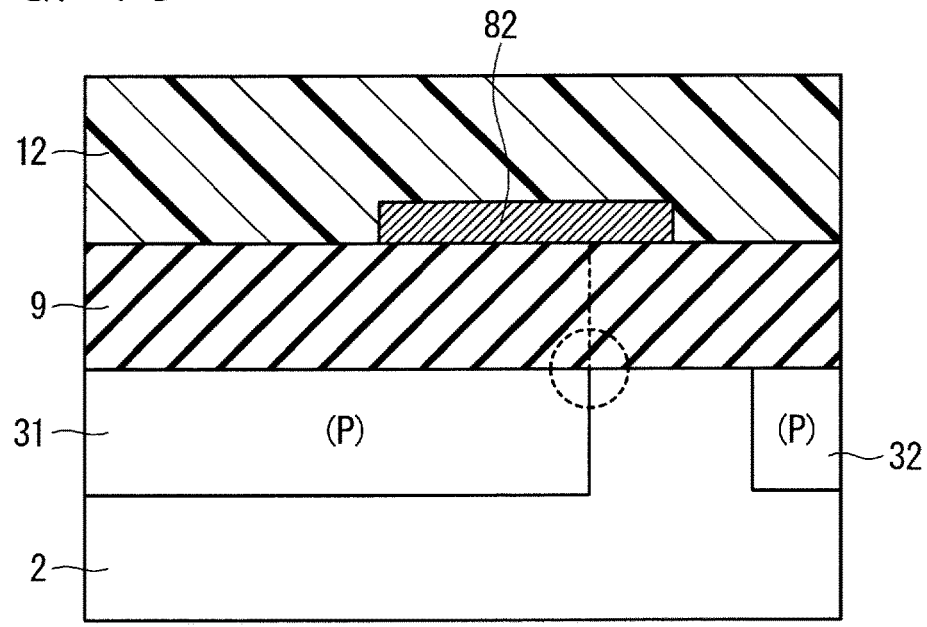
FIG. 19 is a partial cross-sectional view of a modification of the Schottky barrier diode according to the fifth preferred embodiment of the present invention.

FIG. 19 is a partial enlarged view of a region "Y" illustrated in FIG. 18, and a p-n junction between the impurity region 31 and an epitaxial layer 2 surrounded by a broken line in FIG. 18 has a high electric field when a reverse bias is applied. However, when the protective metal film 82 has the outside end edge portion extending to above the p-n junction as illustrated in FIG. 19, water can be prevented from passing through the oxide film protective film 9 to reach the surface of the epitaxial layer 2 at the p-n junction at which electric field strength increases to allow a product to be likely to be formed. As a result, formation of a product is suppressed to suppress peeling of the oxide film protective film 9, so that water resistance can be further improved.

The same applies to a p-n junction between the impurity region 32 and the epitaxial layer 2. Thus, when the protective metal film 82 has the outside end edge portion extending to above the p-n junction, formation of a product can be suppressed.

Sixth Preferred Embodiment

Figure 20:
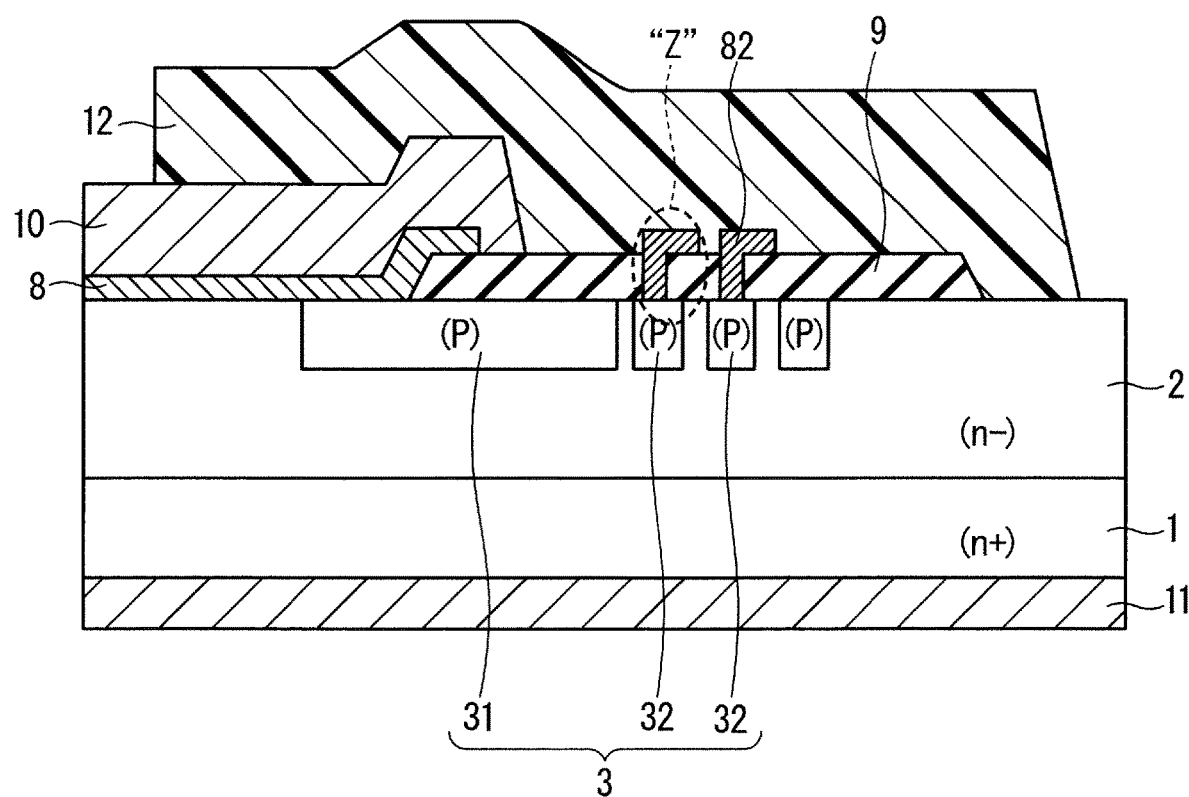
FIG. 20 is a cross-sectional view of a Schottky barrier diode according to a sixth preferred embodiment of the present invention.

FIG. 20 is a cross-sectional view illustrating a structure of a Schottky barrier diode 105 that is a semiconductor device according to a sixth preferred embodiment of the present invention. In FIG. 20, the same components as those of the Schottky barrier diode 90 described with reference to FIG. 1 are denoted by the same reference numerals, and duplicated description is eliminated.

The Schottky barrier diode 105 illustrated in FIG. 20 includes a plurality of protective metal films 82 that is provided on an upper surface of an oxide film protective film 9 at intervals. The protective metal films 82 are each provided having an outside end edge portion extending to above a position exceeding an outside end edge portion of the corresponding one of impurity regions 32 of an electric field limiting region 3 with the oxide film protective film 9 interposed therebetween.

Each of the protective metal films 82 is provided to be joined to the corresponding one of the impurity regions 32 by passing through the oxide film protective film 9, and is provided with not to conduct with a front surface electrode 10.

Figure 21:
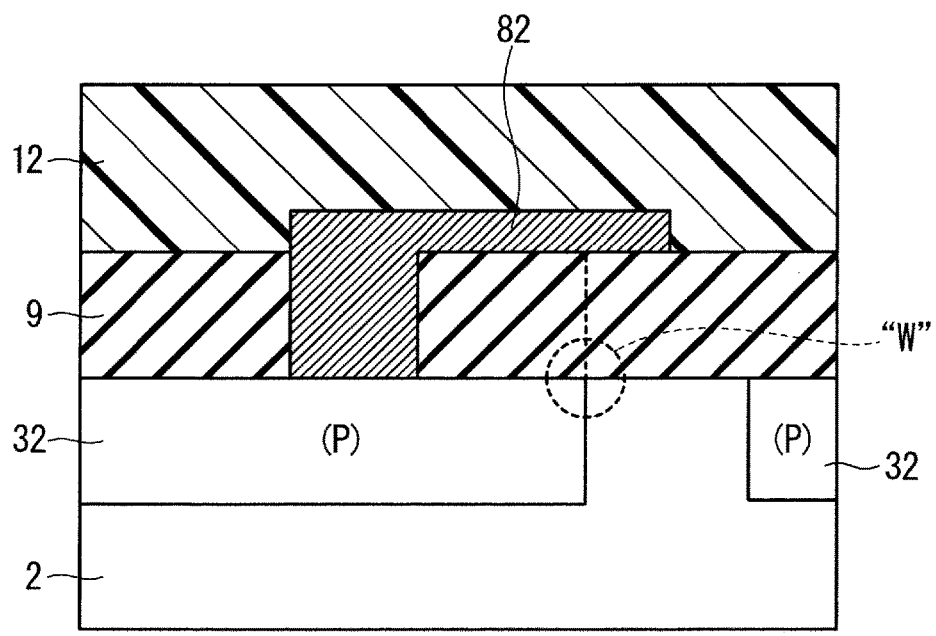
FIG. 21 is a partial cross-sectional view of the Schottky barrier diode according to the sixth preferred embodiment of the present invention.

FIG. 21 is a partial enlarged view of a region "Z" illustrated in FIG. 20, and a p-n junction between the impurity region 32 and an epitaxial layer 2 surrounded by a broken line in FIG. 21 has a high electric field when a reverse bias is applied. However, when the protective metal film 82 has the outside end edge portion extending to above the p-n junction as illustrated in FIG. 21, water can be prevented from passing through the oxide film protective film 9 to reach a surface of the epitaxial layer 2 at the p-n junction at which electric field strength increases to allow a product to be likely to be formed. As a result, formation of a product is suppressed to suppress peeling of the oxide film protective film 9, so that water resistance can be further improved.

While the protective metal film 82 is not provided above an impurity region 31 of the electric field limiting region 3 in FIG. 20, the protective metal film 82 may be also provided above the impurity region 31 having an outside end edge portion extending to above a position exceeding an outside end edge portion of the impurity region 31, with the oxide film protective film 9 interposed therebetween. Then, the protective metal film 82 may serve as a field plate by passing through the oxide film protective film 9 to be joined to the impurity region 31. When a depletion layer of the epitaxial layer 2 is extended by field plate effect of the protective metal film 82, electric field strength at a p-n junction between the impurity region 31 and the epitaxial layer 2 is reduced. The protective metal film 82 joined to the impurity region 31 serves as a field plate because it obtains a negative potential from the impurity region 31 to have a negative bias with respect to the epitaxial layer 2.

While the protective metal film 82 is not provided above every impurity region 32 of the electric field limiting region 3 in FIG. 20, the protective metal film 82 may be provided above every impurity region 32. How to dispose the protective metal film 82 may be appropriately determined based on electric field strength in the electric field limiting region 3.

As with the Schottky barrier diode 103 of the fourth preferred embodiment described with reference to FIG. 15, the Schottky barrier diode 105 may be also configured such that a protective metal film 80 is provided on an end edge portion of the front surface electrode 10, and that a protective metal film 81 is provided on a portion from an outside end edge portion of the oxide film protective film 9 to the front surface of the epitaxial layer 2.

<Application to MOSFET>

Although the Schottky barrier diode has been described as an example in the sixth preferred embodiment described above, the semiconductor device of the sixth preferred embodiment according to the present invention may be a MOSFET.

Figure 22:
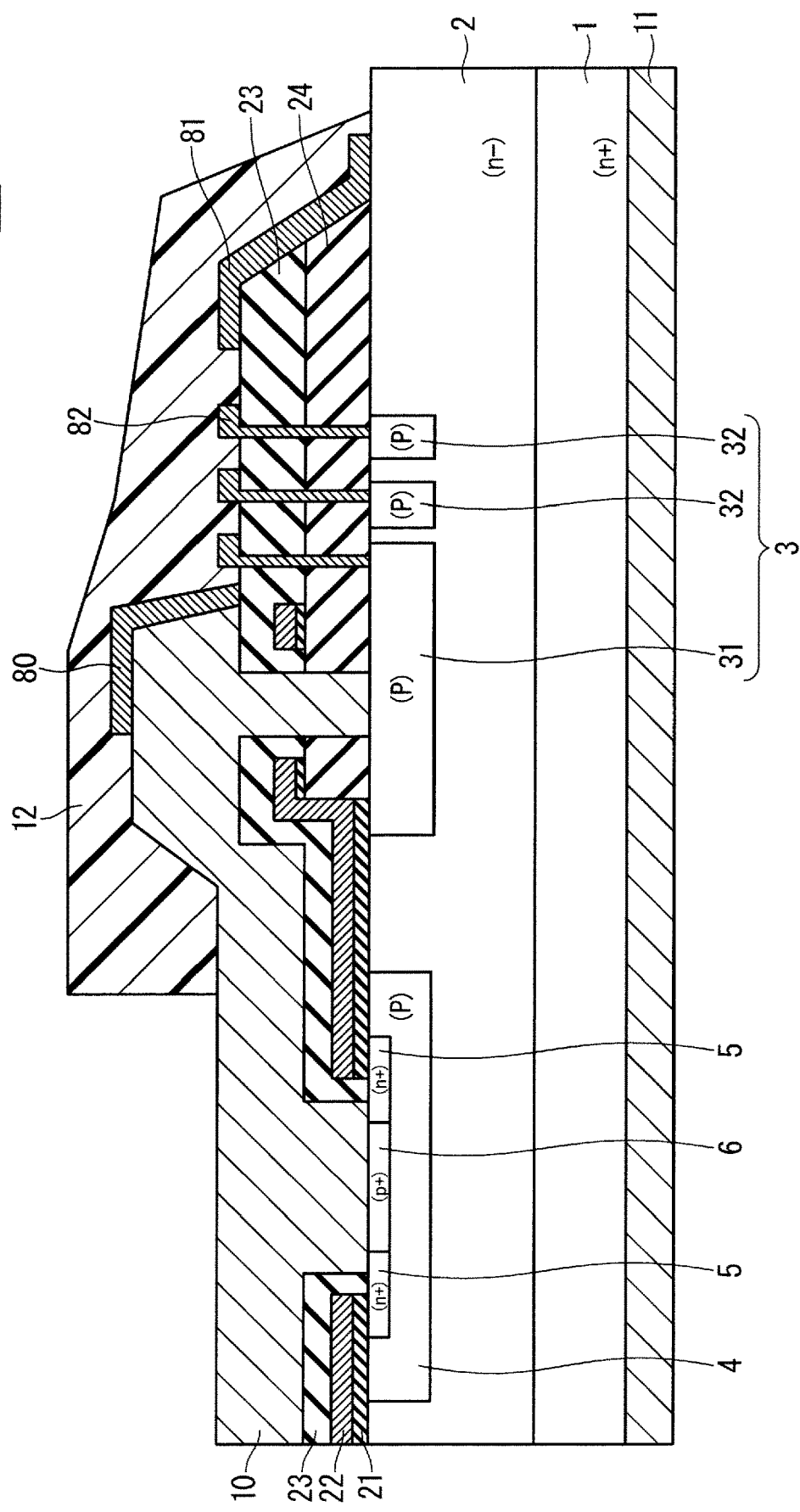
FIG. 22 is a cross-sectional view of a MOSFET according to the sixth preferred embodiment of the present invention.

FIG. 22 is a cross-sectional view illustrating a structure of a MOSFET 202 that is a semiconductor device according to the sixth preferred embodiment of the present invention. In FIG. 22, the same components as those of the MOSFET 200 described with reference to FIG. 6 are denoted by the same reference numerals, and duplicated description is eliminated.

As illustrated in FIG. 22, the MOSFET 202 is configured such that a protective metal film 81 is provided on a portion from an end edge portion of each of an oxide film protective film 24 and an interlayer insulating film 23 that are laminated, to a surface of an epitaxial layer 2, and that a protective metal film 80 is provided from an upper surface of an end edge portion of a front surface electrode 10 to a side surface thereof.

In addition, a plurality of protective metal films 82 is provided on an upper surface of the interlayer insulating film 23 at intervals. The protective metal films 82 are each provided having an outside end edge portion extending to above a position exceeding an outside end edge portion of the corresponding one of impurity regions 31 and 32 of an electric field limiting region 3 with the oxide film protective film 24 and the interlayer insulating film 23 that are laminated and interposed therebetween.

Each of the protective metal films 82 is provided to be joined to the corresponding one of the impurity regions 31 and 32 by passing through the oxide film protective film 24 and the interlayer insulating film 23 that are laminated.

The protective metal film 82 joined to the impurity region 31 serves as a field plate, and when a depletion layer of the epitaxial layer 2 is extended by field plate effect of the protective metal film 82, electric field strength at a p-n junction between the impurity region 31 and the epitaxial layer 2 is reduced.

The protective metal film 82 joined to the impurity region 32 serves as a field plate because it obtains a negative potential from the impurity region 32 to have a negative bias with respect to the epitaxial layer 2. When the protective metal film 82 has the outside end edge portion extending to above a p-n junction between the impurity region 32 and the epitaxial layer 2, water can be prevented from passing through a laminated film of the oxide film protective film 24 and the interlayer insulating film 23 to reach the surface of the epitaxial layer 2 at the p-n junction at which electric field strength increases to allow a product to be likely to be formed. As a result, formation of a product is suppressed to suppress peeling of the oxide film protective film 9, so that water resistance can be further improved.

<Modification>

Figure 23:
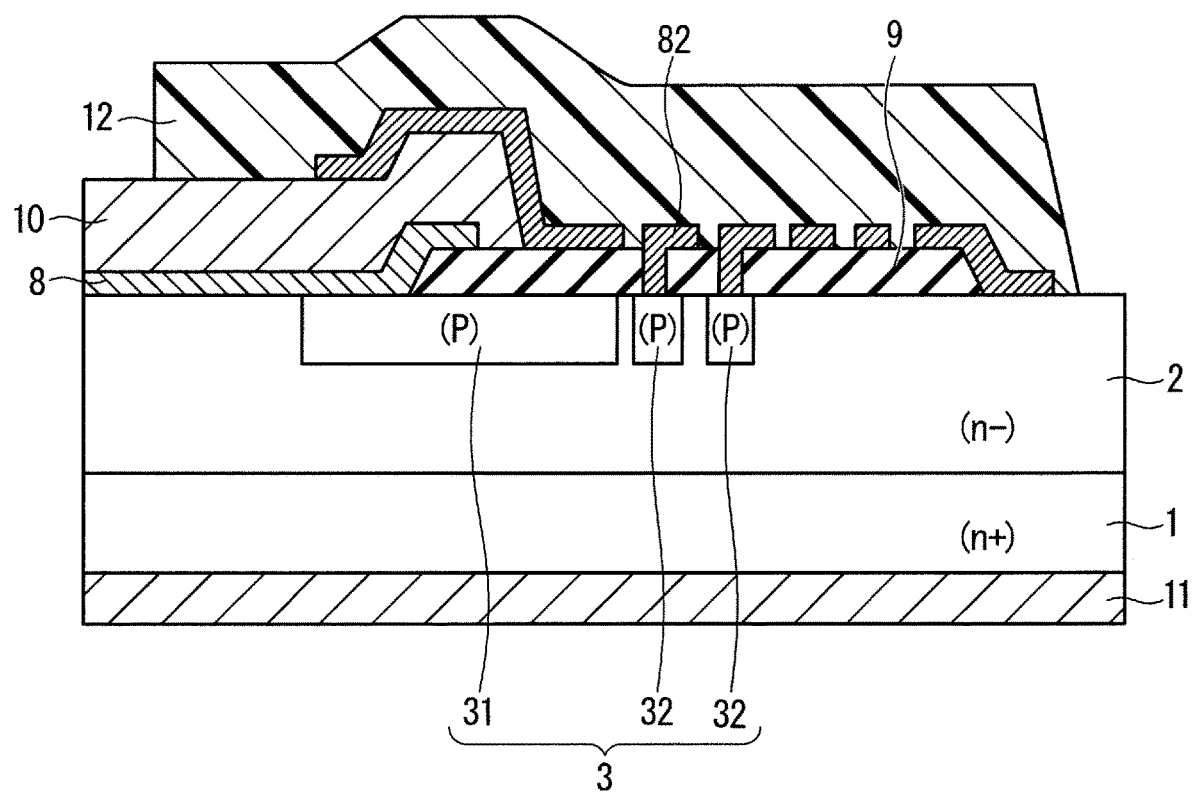
FIG. 23 is a cross-sectional view of a modification of the Schottky barrier diode according to the sixth preferred embodiment of the present invention.

While the sixth preferred embodiment above describes the plurality of protective metal films 82 provided on the oxide film protective film 9 each of which passes through the oxide film protective film 9 to be joined to the impurity region 32 of the electric field limiting region 3, some of the plurality of protective metal films 82 provided on an oxide film protective film 9 may not be joined to the impurity region 32, as in a Schottky barrier diode 105A illustrated in FIG. 23.

When the protective metal film 82 is provided having the outside end edge portion extending to above a position exceeding the outside end edge portion of the impurity region 32 of the electric field limiting region 3 with the oxide film protective film 9 interposed therebetween, water can be prevented from passing through the oxide film protective film 9 to reach the surface of the epitaxial layer 2 at the p-n junction at which electric field strength increases to allow a product to be likely to be formed. As a result, formation of a product is suppressed to suppress peeling of the oxide film protective film 9, so that water resistance can be further improved.

The Schottky barrier diode 105A includes a protective metal film 80 provided on an end edge portion of a front surface electrode 10, and a protective metal film 81 provided on a portion from an outside end edge portion of the oxide film protective film 9 to the front surface of the epitaxial layer 2.

When the Schottky barrier diode 105A is provided with the protective metal film 80 and the protective metal film 81, a failure of the Schottky barrier diode 105A is suppressed to further improve water resistance thereof by suppressing formation of a product on an end edge portion of the front surface electrode 10 and formation of a product on the surface of the epitaxial layer 2 on a device end edge portion side to suppress peeling of the polyimide protective film 12 even when a reverse bias voltage is applied, and water enters the inside of the polyimide protective film 12.

As compared with the first to third preferred embodiments in each of which only one of the protective metal film 80 and the protective metal film 81 is provided, the effect of suppressing the formation of the product is further enhanced.

The protective metal film 80 has an outside end edge portion extending to above a position exceeding an outside end edge portion of the innermost impurity region 31 of the electric field limiting region 3 with the oxide film protective film 9 interposed therebetween.

As described above, the p-n junction between the impurity region 31 of the electric field limiting region 3 and the epitaxial layer 2 has a high electric field, so that a product is formed when water passes through the oxide film protective film 9 to reach a surface of the epitaxial layer 2. However, when the protective metal film 80 has the outside end edge portion extending to above the p-n junction as described above, a depletion layer of the epitaxial layer 2 is extended by field plate effect of the protective metal film 80 to reduce electric field strength at the p-n junction between the impurity region 31 and the epitaxial layer 2.

<Application to Silicon Semiconductor Device>

The structure of each of the first to sixth preferred embodiments described above is particularly effective when an electric field in a termination region is strengthened by reducing the termination region in a SiC semiconductor device excellent in dielectric breakdown strength (withstand voltage). Even when the protective metal films 80 to 82 are provided in a Si semiconductor device, similar effects can be obtained. Even when the structure is applied to a wideband-gap semiconductor device using a wideband-gap semiconductor made of gallium nitride (GaN) or the like, other than SiC, similar effects can be obtained.

The wideband-gap semiconductor device using the wideband-gap semiconductor such as a SiC semiconductor or a GaN semiconductor, having a wideband gap wider than that of a Si semiconductor, is superior in withstand voltage and has high allowable current density compared to a Si semiconductor device, and also has high heat resistance to enable high temperature operation.

In the present invention, each of the preferred embodiments may be freely combined, or any of the preferred embodiments may be appropriately modified and eliminated within the scope of the present invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a semiconductor substrate that allows a main current to flow in a thickness direction of the semiconductor substrate;
   a semiconductor layer of a first conductivity type provided on the semiconductor substrate;
   a first main electrode provided on the semiconductor layer;
   a second main electrode provided on a main surface of the semiconductor substrate, opposite to a side on which the first main electrode is provided;
   an electric field limiting region of a second conductivity type provided in an outside terminal end region on an outer peripheral side of the semiconductor device, outward of an active region in which the main current flows in the semiconductor layer;
   a first protective film covering at least the electric field limiting region;
   a protective metal film provided on a portion from an outside end edge portion of the first protective film to a surface of the semiconductor layer; and
   a second protective film provided covering portions on an end edge portion of the first main electrode, the first protective film, and the protective metal film, wherein
   the protective metal film is provided having an outside end edge portion positioned further outward of an outside end edge portion of the second protective film.

2. The semiconductor device according to claim 1, wherein
   the protective metal film is provided having an outside end edge portion extending to an end of the semiconductor layer.

3. The semiconductor device according to claim 1, wherein
   the semiconductor substrate is a silicon carbide substrate, and
   the semiconductor layer is a semiconductor layer made of silicon carbide.

* * * * *